United States Patent
Zhao et al.

(10) Patent No.: US 9,093,550 B1
(45) Date of Patent: Jul. 28, 2015

(54) INTEGRATED CIRCUITS HAVING A PLURALITY OF HIGH-K METAL GATE FETS WITH VARIOUS COMBINATIONS OF CHANNEL FOUNDATION STRUCTURE AND GATE STACK STRUCTURE AND METHODS OF MAKING SAME

(71) Applicant: MIE Fujitsu Semiconductor Limited, Kuwana (JP)

(72) Inventors: Dalong Zhao, San Jose, CA (US); Pushkar Ranade, Los Gatos, CA (US); Bruce McWilliams, Menlo Park, CA (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 0 days.

(21) Appl. No.: 13/755,887

(22) Filed: Jan. 31, 2013

Related U.S. Application Data

(60) Provisional application No. 61/593,062, filed on Jan. 31, 2012.

(51) Int. Cl.
*H01L 21/8238* (2006.01)
*H01L 21/82* (2006.01)
*H01L 21/02* (2006.01)

(52) U.S. Cl.
CPC .......... *H01L 21/82* (2013.01); *H01L 21/02367* (2013.01)

(58) Field of Classification Search
CPC ................................. H01L 21/823412
See application file for complete search history.

(56) References Cited

U.S. PATENT DOCUMENTS

| | | |
|---|---|---|
| 3,958,266 A | 5/1976 | Athanas |
| 4,000,504 A | 12/1976 | Berger |
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |

(Continued)

FOREIGN PATENT DOCUMENTS

| | | |
|---|---|---|
| EP | 0274278 | 7/1988 |
| EP | 0312237 | 4/1989 |

(Continued)

OTHER PUBLICATIONS

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836 (Dec. 13-15, 2004).

(Continued)

*Primary Examiner* — Zandra Smith
*Assistant Examiner* — Andre' C Stevenson
(74) *Attorney, Agent, or Firm* — Baker Botts L.L.P.

(57) ABSTRACT

Semiconductor manufacturing processes include forming conventional channel field effect transistors (FETs) and deeply depleted channel (DDC) FETs on the same substrate and selectively forming a plurality of gate stack types where those different gate stack types are assigned to and formed in connection with one or more of a conventional channel NFET, a conventional channel PFET, a DDC-NFET, and a DDC-PFET in accordance a with a predetermined pattern.

9 Claims, 16 Drawing Sheets

(56) References Cited

U.S. PATENT DOCUMENTS

| | | | |
|---|---|---|---|
| 4,617,066 A | 10/1986 | Vasudev | |
| 4,662,061 A | 5/1987 | Malhi | |
| 4,761,384 A | 8/1988 | Neppl et al. | |
| 4,780,748 A | 10/1988 | Cunningham et al. | |
| 4,819,043 A | 4/1989 | Yazawa et al. | |
| 4,885,477 A | 12/1989 | Bird et al. | |
| 4,908,681 A | 3/1990 | Nishida et al. | |
| 4,945,254 A | 7/1990 | Robbins | |
| 4,956,311 A | 9/1990 | Liou et al. | |
| 5,034,337 A | 7/1991 | Mosher et al. | |
| 5,144,378 A | 9/1992 | Hikosaka | |
| 5,156,989 A | 10/1992 | Williams et al. | |
| 5,156,990 A | 10/1992 | Mitchell | |
| 5,166,765 A | 11/1992 | Lee et al. | |
| 5,208,473 A | 5/1993 | Komori et al. | |
| 5,294,821 A | 3/1994 | Iwamatsu | |
| 5,298,763 A | 3/1994 | Shen et al. | |
| 5,369,288 A | 11/1994 | Usuki | |
| 5,373,186 A | 12/1994 | Schubert et al. | |
| 5,384,476 A | 1/1995 | Nishizawa et al. | |
| 5,426,328 A | 6/1995 | Yilmaz et al. | |
| 5,444,008 A | 8/1995 | Han et al. | |
| 5,552,332 A | 9/1996 | Tseng et al. | |
| 5,559,368 A | 9/1996 | Hu et al. | |
| 5,608,253 A | 3/1997 | Liu et al. | |
| 5,622,880 A | 4/1997 | Burr et al. | |
| 5,624,863 A | 4/1997 | Helm et al. | |
| 5,625,568 A | 4/1997 | Edwards et al. | |
| 5,641,980 A | 6/1997 | Yamaguchi et al. | |
| 5,663,583 A | 9/1997 | Matloubian et al. | |
| 5,712,501 A | 1/1998 | Davies et al. | |
| 5,719,422 A | 2/1998 | Burr et al. | |
| 5,726,488 A | 3/1998 | Watanabe et al. | |
| 5,726,562 A | 3/1998 | Mizuno | |
| 5,731,626 A | 3/1998 | Eaglesham et al. | |
| 5,736,419 A | 4/1998 | Naem | |
| 5,753,555 A | 5/1998 | Hada | |
| 5,754,826 A | 5/1998 | Gamal et al. | |
| 5,756,365 A | 5/1998 | Kakumu | |
| 5,763,921 A | 6/1998 | Okumura et al. | |
| 5,780,899 A | 7/1998 | Hu et al. | |
| 5,847,419 A | 12/1998 | Imai et al. | |
| 5,856,003 A | 1/1999 | Chiu | |
| 5,861,334 A | 1/1999 | Rho | |
| 5,877,049 A | 3/1999 | Liu et al. | |
| 5,885,876 A | 3/1999 | Dennen | |
| 5,889,315 A | 3/1999 | Farrenkopf et al. | |
| 5,895,954 A | 4/1999 | Yasumura et al. | |
| 5,899,714 A | 5/1999 | Farremkopf et al. | |
| 5,918,129 A | 6/1999 | Fulford, Jr. et al. | |
| 5,923,067 A | 7/1999 | Voldman | |
| 5,923,987 A | 7/1999 | Burr | |
| 5,936,868 A | 8/1999 | Hall | |
| 5,946,214 A | 8/1999 | Heavlin et al. | |
| 5,985,705 A | 11/1999 | Seliskar | |
| 5,989,963 A | 11/1999 | Luning et al. | |
| 6,001,695 A | 12/1999 | Wu | |
| 6,020,227 A | 2/2000 | Bulucea | |
| 6,043,139 A | 3/2000 | Eaglesham et al. | |
| 6,060,345 A | 5/2000 | Hause et al. | |
| 6,060,364 A | 5/2000 | Maszara et al. | |
| 6,066,533 A | 5/2000 | Yu | |
| 6,072,217 A | 6/2000 | Burr | |
| 6,087,210 A | 7/2000 | Sohn | |
| 6,087,691 A | 7/2000 | Hamamoto | |
| 6,088,518 A | 7/2000 | Hsu | |
| 6,091,286 A | 7/2000 | Blauschild | |
| 6,096,611 A | 8/2000 | Wu | |
| 6,103,562 A | 8/2000 | Son et al. | |
| 6,121,153 A | 9/2000 | Kikkawa | |
| 6,147,383 A | 11/2000 | Kuroda | |
| 6,153,920 A | 11/2000 | Gossmann et al. | |
| 6,157,073 A | 12/2000 | Lehongres | |
| 6,175,582 B1 | 1/2001 | Naito et al. | |
| 6,184,112 B1 | 2/2001 | Maszara et al. | |
| 6,190,979 B1 | 2/2001 | Radens et al. | |
| 6,194,259 B1 | 2/2001 | Nayak et al. | |
| 6,198,157 B1 | 3/2001 | Ishida et al. | |
| 6,218,892 B1 | 4/2001 | Soumyanath et al. | |
| 6,218,895 B1 | 4/2001 | De et al. | |
| 6,221,724 B1 | 4/2001 | Yu et al. | |
| 6,229,188 B1 | 5/2001 | Aoki et al. | |
| 6,232,164 B1 | 5/2001 | Tsai et al. | |
| 6,235,597 B1 | 5/2001 | Miles | |
| 6,245,618 B1 | 6/2001 | An et al. | |
| 6,268,640 B1 | 7/2001 | Park et al. | |
| 6,271,070 B2 | 8/2001 | Kotani et al. | |
| 6,271,551 B1 | 8/2001 | Schmitz et al. | |
| 6,288,429 B1 | 9/2001 | Iwata et al. | |
| 6,297,132 B1 | 10/2001 | Zhang et al. | |
| 6,300,177 B1 | 10/2001 | Sundaresan et al. | |
| 6,313,489 B1 | 11/2001 | Letavic et al. | |
| 6,319,799 B1 | 11/2001 | Ouyang et al. | |
| 6,320,222 B1 | 11/2001 | Forbes et al. | |
| 6,323,525 B1 | 11/2001 | Noguchi et al. | |
| 6,326,666 B1 | 12/2001 | Bernstein et al. | |
| 6,335,233 B1 | 1/2002 | Cho et al. | |
| 6,358,806 B1 | 3/2002 | Puchner | |
| 6,380,019 B1 | 4/2002 | Yu et al. | |
| 6,391,752 B1 | 5/2002 | Colinge et al. | |
| 6,426,260 B1 | 7/2002 | Hshieh | |
| 6,426,279 B1 | 7/2002 | Huster et al. | |
| 6,432,754 B1 | 8/2002 | Assaderaghi et al. | |
| 6,444,550 B1 | 9/2002 | Hao et al. | |
| 6,444,551 B1 | 9/2002 | Ku et al. | |
| 6,449,749 B1 | 9/2002 | Stine | |
| 6,461,920 B1 | 10/2002 | Shirahata et al. | |
| 6,461,928 B2 | 10/2002 | Rodder | |
| 6,472,278 B1 | 10/2002 | Marshall et al. | |
| 6,482,714 B1 | 11/2002 | Hieda et al. | |
| 6,489,224 B1 | 12/2002 | Burr | |
| 6,492,232 B1 | 12/2002 | Tang et al. | |
| 6,500,739 B1 | 12/2002 | Wang et al. | |
| 6,503,801 B1 | 1/2003 | Rouse et al. | |
| 6,503,805 B2 | 1/2003 | Wang et al. | |
| 6,506,640 B1 | 1/2003 | Ishida et al. | |
| 6,518,623 B1 | 2/2003 | Oda et al. | |
| 6,521,470 B1 | 2/2003 | Lin et al. | |
| 6,534,373 B1 | 3/2003 | Yu | |
| 6,541,328 B2 | 4/2003 | Whang et al. | |
| 6,541,829 B2 | 4/2003 | Nishinohara et al. | |
| 6,548,842 B1 | 4/2003 | Bulucea et al. | |
| 6,551,885 B1 | 4/2003 | Yu | |
| 6,552,377 B1 | 4/2003 | Yu | |
| 6,573,129 B2 | 6/2003 | Hoke et al. | |
| 6,576,535 B2 | 6/2003 | Drobny et al. | |
| 6,600,200 B1 | 7/2003 | Lustig et al. | |
| 6,620,671 B1 | 9/2003 | Wang et al. | |
| 6,624,488 B1 | 9/2003 | Kim | |
| 6,627,473 B1 | 9/2003 | Oikawa et al. | |
| 6,630,710 B1 | 10/2003 | Augusto | |
| 6,660,605 B1 | 12/2003 | Liu | |
| 6,662,350 B2 | 12/2003 | Fried et al. | |
| 6,667,200 B2 | 12/2003 | Sohn et al. | |
| 6,670,260 B1 | 12/2003 | Yu et al. | |
| 6,693,333 B1 | 2/2004 | Yu | |
| 6,724,008 B2 * | 4/2004 | Fitzergald | 257/19 |
| 6,730,568 B2 | 5/2004 | Sohn | |
| 6,737,724 B2 | 5/2004 | Hieda et al. | |
| 6,743,291 B2 | 6/2004 | Ang et al. | |
| 6,743,684 B2 | 6/2004 | Liu | |
| 6,751,519 B1 | 6/2004 | Satya et al. | |
| 6,753,230 B2 | 6/2004 | Sohn et al. | |
| 6,760,900 B2 | 7/2004 | Rategh et al. | |
| 6,770,944 B2 | 8/2004 | Nishinohara et al. | |
| 6,787,424 B1 | 9/2004 | Yu | |
| 6,797,553 B2 | 9/2004 | Adkisson et al. | |
| 6,797,602 B1 | 9/2004 | Kluth et al. | |
| 6,797,994 B1 | 9/2004 | Hoke et al. | |
| 6,808,004 B2 | 10/2004 | Kamm et al. | |
| 6,808,994 B1 | 10/2004 | Wang | |
| 6,813,750 B2 | 11/2004 | Usami et al. | |
| 6,821,825 B2 | 11/2004 | Todd et al. | |
| 6,821,852 B2 | 11/2004 | Rhodes | |

(56) References Cited

U.S. PATENT DOCUMENTS

| | | |
|---|---|---|
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jaehne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 2,977,994 A1 | 11/2007 | Wieczorek et al. |
| 7,294,877 B2 | 11/2007 | Rueckes et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |

(56) References Cited

U.S. PATENT DOCUMENTS

| | | | |
|---|---|---|---|
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,943,462 B1 | 5/2011 | Beyer et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,306 B2 * | 11/2011 | Carter et al. ............ 438/228 |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,273,617 B2 * | 9/2012 | Thompson et al. ............ 438/197 |
| 8,286,180 B2 | 10/2012 | Foo |
| 8,288,798 B2 | 10/2012 | Passlack |
| 8,294,180 B2 | 10/2012 | Doyle et al. |
| 8,299,562 B2 | 10/2012 | Li et al. |
| 8,324,059 B2 | 12/2012 | Guo et al. |
| 8,372,721 B2 | 2/2013 | Chen et al. |
| 8,466,473 B2 * | 6/2013 | Cai et al. ............ 257/77 |
| 8,569,128 B2 * | 10/2013 | Shifren et al. ............ 438/217 |
| 8,803,233 B2 * | 8/2014 | Cheng et al. ............ 257/335 |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkale et al. |
| 2009/0011537 A1 | 1/2009 | Shimizu et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |

(56) References Cited

U.S. PATENT DOCUMENTS

| | | |
|---|---|---|
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren |
| 2011/0294278 A1 | 12/2011 | Eguchi et al. |
| 2011/0309447 A1 | 12/2011 | Arghavani et al. |
| 2012/0007194 A1 | 1/2012 | Sakakidani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146148 A1 | 6/2012 | Iwamatsu |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | |
|---|---|---|
| EP | 0531621 | 3/1993 |
| EP | 0383515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93 (2006).

Wong, H et al., "Nanoscale CMOS", Proceedings of the IEEE, Vo. 87, No. 4, pp. 537-570 (Apr. 1999).

Banerjee, et al. "Compensating Non-Optical Effects using Electrically-Driven Optical Proximity Correction", Proc. of SPIE vol. 7275 72750E (2009).

Cheng, et al. "Extremely Thin SOI (ETSOI) CMOS with Record Low Variability for Low Power System-on-Chip Applications", Electron Devices Meeting (IEDM) (Dec. 2009).

Cheng, et al. "Fully Depleted Extremely Thin SOI Technology Fabricated by a Novel Intergration Scheme Featuring Implant-Free, Zero-Silicon-Loss, and Faceted Raised Source/Drain", Symposium on VLSI Technology Digest of Technical Papers, pp. 212-213 (2009).

Drennan, et al. "Implications of Proximity Effects for Analog Design", Custom Integrated Circuits Conference, pp. 169-176 (Sep. 2006).

Hook, et al. "Lateral Ion Implant Straggle and Mask Proximity Effect", IEEE Transactions on Electron Devices, vol. 50, No. 9, pp. 1946-1951 (Sep. 2003).

Hori, et al., "A 0.1 μm CMOS with a Step Channel Profile Formed by Ultra High Vacuum CVD and In-Situ Doped Ions", Proceedings of the International Electron Devices Meeting, New York, IEEE, US, pp. 909-911 (Dec. 5, 1993).

Matshuashi, et al. "High-Performance Double-Layer Epitaxial-Channel PMOSFET Compatible with a Single Gate CMOSFET", Symposium on VLSI Technology Digest of Technical Papers, pp. 36-37 (1996).

Shao, et al., "Boron Diffusion in Silicon: The Anomalies and Control by Point Defect and Engineering", Materials Science and Engineering R: Reports, vol. 42, No. 3-4, pp. 65-114, Nov. 1, 2003 (Nov. 2012).

Sheu, et al. "Modeling the Well-Edge Proximity Effect in Highly Scaled MOSFETs", IEEE Transactions on Electron Devices, vol. 53, No. 11, pp. 2792-2798 (Nov. 2006).

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, pp. 23-24 (1995).

Chau, R et al., "A 50nm Depleted-Substrate CMOS Transistor (DST)", Electron Device Meeting 2001, IEDM Technical Digest, IEEE International, pp. 29.1.1-29.1.4 (2001).

Ducroquet, F et al. "Fully Depleted Silicon-On-Insulator nMOSFETs with Tensile Strained High Carbon Content Si1-yCy Channel", ECS 210th Meeting, Abstract 1033 (2006).

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961 (2006).

Goesele, U et al., Diffusion Engineering by Carbon in Silicon, Mat. Res. Soc. Symp. vol. 610, pp. 1-12 (2000).

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113 (2008).

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4 (2009).

Holland, OW and Thomas, DK "A Method to Improve Activation of Implanted Dopants in SiC", Oak Ridge National Laboratory, Oak Ridge, TN, pp. 1-9 (2001).

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462 (1996).

Lavéant, P. "Incorporation, Diffusion and Agglomeration of Carbon in Silicon", Solid State Phenomena, vols. 82-84, pp. 189-194 (2002).

Noda, K et al., "A 0.1-μm Delta-Doped MOSFET Fabricated with Post-Low-Energy Implanting Selective Epitaxy" IEEE Tansaction on Electron Devices, vol. 45, No. 4, pp. 809-814 (Apr. 1998).

Ohguro, T et al., "An 0.1-μm CMOS for Mixed Digital and Analog Aplications with Zero-Volt-Vth Epitaxial-Channel MOSFET's", IEEE Transactions on Electron Devices, vol. 46, No. 7, pp. 1378-1383 (Jul. 1999).

Pinacho, R et al., "Carbon in Silicon: Modeling of Diffusion and Clustering Mechanisms", Journal of Applied Physics, vol. 92, No. 3, pp. 1582-1588 (Aug. 2002).

Robertson, LS et al., "The Effect of Impurities on Diffusion and Activation of Ion Implanted Boron in Silicon", Mat. Res. Soc. Symp. vol. 610, pp. B5 8.1-B5 8.6 (2000).

Scholz, R et al., "Carbon-Induced Undersaturation of Silicon Self-Interstitials", Appl. Phys. Lett. 72(2), pp. 200-202 (Jan. 1998).

Scholz, RF et al., "The Contribution of Vacancies to Carbon Out-Diffusion in Silicon", Appl. Phys. Lett., vol. 74, No. 3, pp. 392-394 (Jan. 1999).

Stolk, PA et al., "Physical Mechanisms of Transient Enhanced Dopant Diffusion in Ion-Implanted Silicon", J. Appl. Phys. 81(9), pp. 6031-6050 (May 1997).

Thompson, S et al., "MOS Scaling: Transistor Challenges for 21st Century", Intel Technology Journal Q3' 1998, pp. 1-19 (1998).

Wann, C. et al., "Channel Profile Optimization and Device Design for Low-Power High-Performance Dynamic-Threshold MOSFET", IEDM 96, pp. 113-116 (1996).

(56) References Cited

OTHER PUBLICATIONS

Werner, P. et al., "Carbon Diffusion in Silicon", Applied Physics Letters, vol. 73, No. 17, pp. 2465-2467 (Oct. 1998).

Yan, Ran-Hon et al., "Scaling the Si MOSFET: From Bulk to SOI to Bulk", IEEE Transactions on Electron Devices, vol. 39, No. 7, pp. 1704-1711 (Jul. 1992).

\* cited by examiner

INTEGRATED CIRCUITS HAVING A PLURALITY OF HIGH-K METAL GATE FETS WITH VARIOUS COMBINATIONS OF CHANNEL FOUNDATION STRUCTURE AND GATE STACK STRUCTURE AND METHODS OF MAKING SAME

CROSS-REFERENCE TO RELATED APPLICATIONS

This nonprovisional patent application claims the benefit of earlier filed U.S. provisional application No. 61/593,062, entitled "Integrated Circuits Having A Plurality Of High-K Metal Gate FETs With Various Combinations Of Channel Foundation Structure And Gate Stack Structure And Methods Of Making Same," filed 31 Jan., 2012, and incorporated herein by reference in its entirety.

INCORPORATION BY REFERENCE OF ADDITIONAL DOCUMENTS

The following are incorporated herein by reference: U.S. patent application Ser. No. 12/708,497, filed 18 Feb. 2010, titled "Electronic Devices and Systems, and Methods for Making and Using the Same," by Scott E. Thompson et al., now U.S. Pat. No. 8,273,617; U.S. patent application Ser. No. 12/971,884, filed 17 Dec. 2010, titled "Low Power Semiconductor Transistor Structure and Method of Fabrication Thereof;" U.S. patent application Ser. No. 12/971,955, filed 17 Dec. 2010, titled "Transistor with Threshold Voltage Set Notch and Method of Fabrication Thereof;" U.S. patent application Ser. No. 12/895,785, filed 30 Sep. 2010, titled "Advanced Transistors With Threshold Voltage Set Dopant Structures;" U.S. patent application Ser. No. 12/960,266, filed 3 Dec. 2010, titled "Semiconductor Structure and Method of Fabrication Thereof with Mixed Metal Types;" and U.S. patent application Ser. No. 13/459,971, filed 30 Apr. 2012, titled "Multiple Transistor Types Formed in a Common Epitaxial Layer by Differential Out-Diffusion From a Doped Underlayer;" the disclosures of which are hereby incorporated by reference in their entirety.

FIELD OF THE INVENTION

The present invention relates generally to integrated circuits and processes for making integrated circuits.

BACKGROUND

Advances in semiconductor manufacturing technologies have resulted in dramatically increased circuit packing densities and higher speeds of operation. In order to achieve such increased densities and circuit speeds, a wide variety of evolutionary changes have taken place with respect to semiconductor processing techniques and semiconductor device structures.

Some of the more recent changes in metal-oxide-semiconductor field effect transistor (MOSFET) semiconductor processing and device structures include gate replacement structures and manufacturing methods for such. In gate replacement, conventional polysilicon-based gate stack structures are removed after source/drain formation, and a gate stack with a high-k gate dielectric layer and a metal gate electrode (HKMG) are provided in their place. Various combinations of metals and metal alloys are selected by manufacturers to set a nominal value for the work function of the gate electrode. Such efforts are commonly referred to as work function engineering. It is well-known that the work function of the gate electrode is one of the factors in establishing the threshold voltage of a MOSFET.

In addition to changes in the gate stack structure, changes in the semiconductor body underlying the gate stack have also been adopted. A partial list of these changes includes the use of complex doping profiles, strained silicon, fully depleted silicon-on-insulator, raised source/drains, epitaxial silicon layers and finFET structures.

Typically, a semiconductor manufacturer develops a process, and then provides electrical modeling data and physical layout rules to chip designers. Chip designers, or more commonly the company by which the chip designers are employed, arrange for production of their circuit designs as integrated circuits fabricated by the semiconductor manufacturer.

As new transistor structures become available, where those new structures have certain desirable electrical properties, chip designers often wish to take advantage of those desirable electrical properties in at least some portion, or subset, of the circuitry in an existing chip design. By way of example, System on a Chip (SoC) devices often include blocks of pre-designed circuitry some of which may be supplied from different vendors. In order to get the desired performance from each of those blocks, different transistor characteristics may be needed in the different blocks. Put differently, it may be desirable to include a plurality of transistor types having various combinations of channel structures and gate stacks.

What is needed are integrated circuits with multiple transistor structures, each with its own unique electrical characteristics, and methods of integrating the manufacture thereof into a single process flow.

BRIEF DESCRIPTION OF THE DRAWINGS

Exemplary embodiments of the invention are described with reference to the accompanying drawings. In the drawings, like reference numbers indicate identical or functionally similar elements.

DETAILED DESCRIPTION

Figure 1:
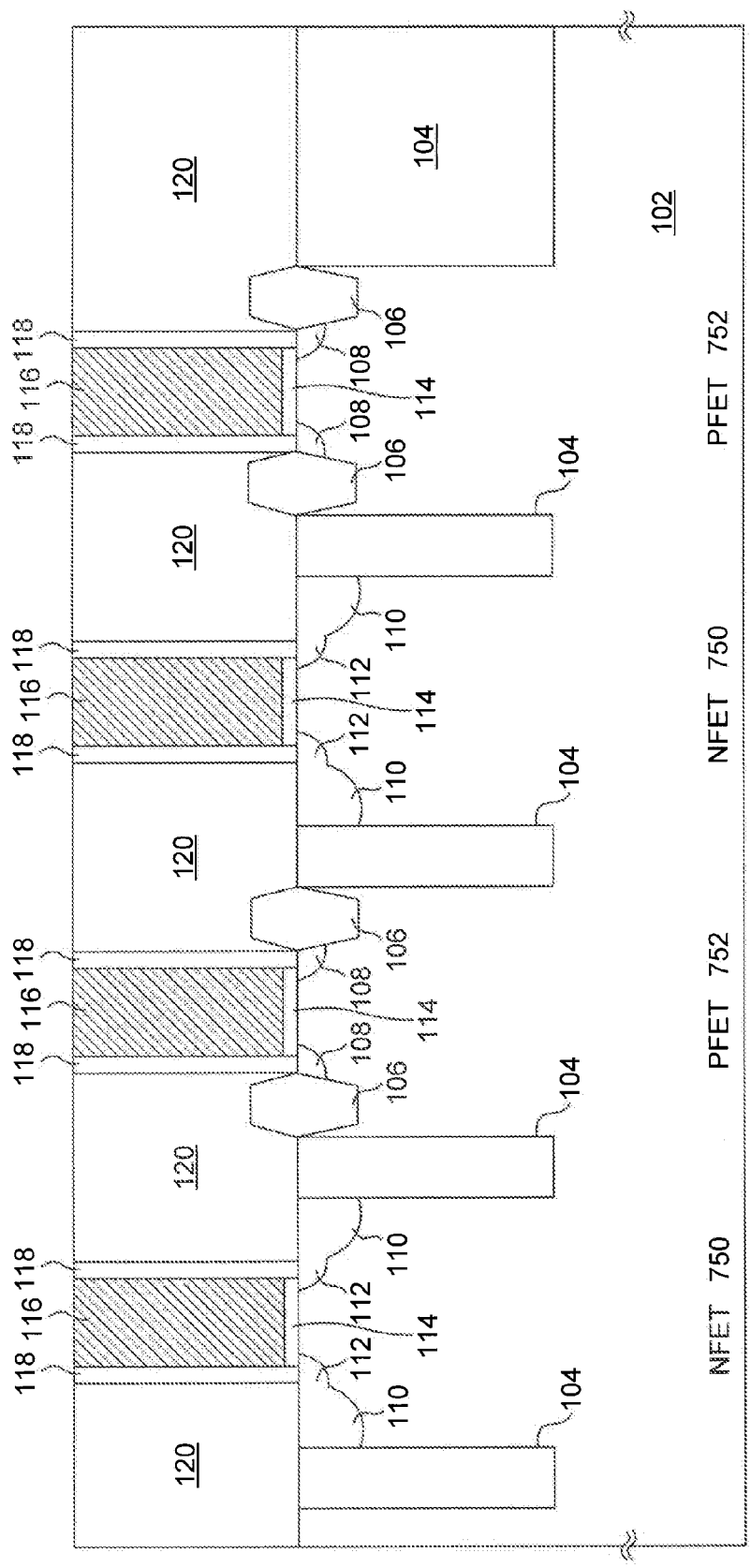
FIG. 1 is a cross-sectional representation of a portion of a wafer having a partially fabricated integrated circuit thereon in accordance with a baseline process.

The following Detailed Description refers to accompanying drawings to illustrate exemplary embodiments consistent with the invention. References in the Detailed Description to "one exemplary embodiment," "an illustrative embodiment," "an exemplary embodiment," and so on, indicate that the exemplary embodiment described may include a particular feature, structure, or characteristic, but every exemplary or illustrative embodiment may not necessarily include that particular feature, structure, or characteristic. Moreover, such phrases are not necessarily referring to the same exemplary embodiment. Further, when a particular feature, structure, or characteristic is described in connection with an embodiment, it is within the knowledge of those skilled in the relevant art(s) to affect such feature, structure, or characteristic in connection with other embodiments whether or not explicitly described.

The exemplary embodiments described herein are provided for illustrative purposes, and are not limiting. Other embodiments are possible, and modifications may be made to the exemplary embodiments within the spirit and scope of the invention. Therefore, the Detailed Description is not meant to limit the invention. Rather, the scope of the invention is defined only in accordance with the subjoined claims and their equivalents.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Terminology

The terms, chip, die, integrated circuit, semiconductor device, and microelectronic device, are often used interchangeably in the field of electronics. The present invention is applicable to all the above as these terms are generally understood in the field.

With respect to chips, it is common that power, ground, and various signals may be coupled between them and other circuit elements via physical, electrically conductive connections. Such a point of connection may be referred to as an input, output, input/output (I/O), terminal, line, pin, pad, port, interface, or similar variants and combinations. Although connections between and amongst chips are commonly made by way of electrical conductors, those skilled in the art will appreciate that chips and other circuit elements may alternatively be coupled by way of optical, mechanical, magnetic, electrostatic, and electromagnetic interfaces.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, such as aluminum (Al), copper (Cu), an alloy of Al and Cu, an alloy of Al, Cu and silicon (Si), tungsten (W), and nickel (Ni) are conductors that provide signal paths for coupling or interconnecting, electrical circuitry. Other conductors, both metal and non-metal are available in microelectronic devices. Materials such as gold (Au), cobalt (Co), doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

Epitaxial layer refers to a layer of single crystal semiconductor material. In this field, the epitaxial layer is commonly referred to "epi."

FET, as used herein, refers to field effect transistor. An n-channel FET is referred to herein as an NFET. A p-channel FET is referred to herein as a PFET. Unless noted otherwise the FETs referred to herein are MOSFETs rather than junction FETs (JFETs).

As used herein, "gate" refers to the insulated gate terminal of a FET. The insulated gate terminal of a FET is also referred to in this field as a "gate electrode." Historically, the gate electrode was a single structure such as a layer of doped polysilicon disposed on the gate dielectric. More recently, semiconductor manufacturing processes have used several layers of various materials to produce the desired electrical characteristics.

Source/drain (S/D) terminals refer to the terminals of a FET, between which conduction occurs under the influence of an electric field, subsequent to the inversion of the semiconductor surface under the influence of an electric field resulting from a voltage applied to the gate terminal of the FET. Generally, the source and drain terminals of a FET are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

The expression "gate stack" refers to the gate electrode and the gate dielectric that separates the gate electrode from the semiconductor body.

The term "channel" as used herein refers to a three-dimensional region of mobile carriers formed subjacent to the interface between the substrate and the gate stack of a FET responsive to application of an electric field to the gate electrode.

The expression "depletion region" as used herein refers to a three-dimensional region subjacent to the gate stack of a FET where that region has been depleted of mobile charges leaving, in a doped region of the body, ionized dopant sites. The depletion region forms responsive to the application of an electric field. It is noted that the size of the depletion region is a related to the doping profile in the region and the applied voltage. In a conventional NFET with a p-type body, the depletion region is characterized by ionized non-mobile acceptor sites. In a conventional PFET with an n-type body, the depletion region is characterized by ionized non-mobile donor sites.

The expression "channel foundation structure" refers to the crystalline structure and doping profile of the body subjacent to the gate stack, together with the S/D structures.

The expression "DDC channel foundation" refers to a channel foundation structure with an undoped, or substantially undoped, epi layer disposed subjacent the gate dielectric layer, a doped threshold adjustment epi layer disposed subjacent the undoped epi layer, and a highly doped screening region disposed subjacent the threshold adjustment layer. Various DDC channel foundation structures may include one or more dopant layers, including but not limited to carbon (C) especially in the case of DDC-NFETs, for reducing or eliminating migration of other dopant species upward into the undoped epi.

The term "high-k" refers to a dielectric constant greater than that of silicon dioxide.

Together, a gate stack disposed adjacent to a channel foundation structure forms a FET.

Together, a gate stack disposed adjacent to a DDC channel foundation forms a DDC-FET. A p-channel DDC-FET is referred to herein as a DDC-PFET. An n-channel DDC-FET is referred to herein as a DDC-NFET.

The terms contact and via, both refer to structures for electrical connection of conductors from different levels of a chip. By way of example and not limitation, such electrical connections may be made between two metal lines on different interconnect levels of a chip, between a polysilicon line and a metal line, between a S/D junction and a metal line, and so on. These terms are sometimes used in the art to describe both an opening in an insulator in which the structure will be completed, and the completed structure itself. For purposes of this disclosure, contact and via both refer to the completed structure. Further, for purposes of this disclosure, contact refers to the structure used to form a connection between the first layer of metal and electrically conductive structures closer to the substrate; and via refers to the structure used to form a connection between metal layers including the first metal layer and the metal layers above it.

Substrate, as used herein, refers to the physical object that is the basic workpiece that is transformed by various process operations into the desired microelectronic configuration. A substrate may also be referred to as a wafer. Wafers, may be made of semiconducting, non-semiconducting, or combinations of semiconducting and non-semiconducting materials (e.g., a silicon-on-insulator (SOI) wafer).

The term vertical, as used herein, means substantially perpendicular to the surface of a substrate.

Overview

As noted above, chip designers often wish to incorporate the latest advances in electrical performance that are obtainable through the use of newly available transistor structures, without necessarily moving the entire chip design to a smaller technology node. This is often the case where the new transistor structure is available at the same technology node (i.e., manufacturing dimensions) as an existing design. By way of example, the transistors that make up a particular circuit block such as a memory could be replaced with the new transistor structures to achieve the desired electrical result without having to modify other circuits that have already been validated.

One family of newly available transistor structures is referred to herein as DDC-FETs. DDC-FETs have a number of advantages in terms of electrical performance over conventional FETs at the same technology node. These advantages include, but are not in any way limited to, reduced subthreshold conduction (i.e., reduced off-state leakage current). Because modern integrated circuits typically include many millions of transistors, even small amounts of leakage current in these transistors rapidly becomes a drain on the battery of a mobile device, and/or a heat dissipation problem requiring heavy, and space-consuming heat sinks or fans.

DDC-FETs are also advantageous in terms of reduced threshold voltage variation across a given region of an integrated circuit. This type of threshold voltage variation is referred to as sigma $V_t$ ($\sigma V_t$). Circuit designers recognize the many well-known benefits of reduced variation (or increased uniformity) in the electrical characteristics of the devices that are available for them to incorporate into their designs. By way of example and not limitation, the use of devices with a smaller variation in electrical characteristics can provide circuit designs with improved performance margins.

Since it is desirable to reduce power, and to improve performance margins, as soon as is practical, there is a desire to begin the change-over to DDC-FETs as soon as possible. At the same time, because of the expense involved in validating a new design, generating mask sets, and making or purchasing wafers, some chip designers prefer to make changes in stages. In accordance with such a philosophy, chip designers may decide to replace only portions of a chip design with the newly available DDC-FETs.

Additionally, chip designers producing SoCs (System On a Chip) often license-in various "IP" blocks, i.e., pre-designed circuit blocks having a known function. In some license arrangements it might not be permitted for the chip designers to make changes to such a licensed circuit block. In accordance with such a contractual limitation, chip designers may decide to replace only portions of a chip design with the newly available DDC-FETs.

In order to satisfy the above-described needs and constraints, it is necessary to combine multiple transistor architectures, or structures, within the same integrated circuit.

In order to maintain the economic feasibility of combining multiple transistor architectures within an integrated circuit, new process flows have been developed by the inventors that provide cost-effective integration of multiple transistor structures within an integrated circuit. Various illustrative embodiments of such novel and non-obvious processes are set forth below.

In various embodiments, DDC-FETs are incorporated into an integrated circuit that includes FETs of alternative structures, or architectures. DDC refers to the channel region of a FET that has been physically constructed to provide a desired set of electrical characteristics, including but not limited to higher mobility, higher drive current, lower drain induced barrier lowering ("DIBL") and reduced threshold voltage variations.

In order to facilitate the description of the combinations of different transistor structures, the FETs are often described herein in terms of their channel foundation structure, and their gate stack structure. A plurality of different transistor structures are compatibly integrated by a process flow to produce integrated circuit structures and circuits as illustrated in exemplary embodiments herein. Various embodiments are described herein where HKMG FETs are fabricated in a gate-last style of gate replacement processing, and where the channel foundation and the gate stack structure are mixed and matched on a single integrated circuit. In this way, DDC FETs may be integrated with conventional FETs independent of a particular gate-stack architecture.

Process

FIGS. 1-15 illustrate a process flow including process options for gate stack formation. These process options allow the integration of both NFETs and PFETs where each transistor type may have a different channel foundation structure and/or a different gate stack. In other words, various embodiments provide integrated circuits that combine conventional transistors and DDC transistors, and optional combinations of gate stacks so as to simplify processing while delivering the desired electrical characteristics.

Various embodiments provide for re-use of at least a portion of the available gate stack materials and structures available in semiconductor manufacturing. This simplifies manufacturing. Rather than fabricating a unique gate stack structure for each type of transistor on an integrated circuit, the gate stack materials and structure, together with the transistor's underlying channel foundations, are selected such that at least two different types of transistor can use the same gate stack materials and structure. In this way, the same gate stack structure can be concurrently fabricated for the at least two different types of transistors. As described below, gate stack materials and structure affect the threshold voltage of a transistor. Thus embodiments provide integrated circuits that have more transistor types than gate stack types.

In the process embodiments herein, even though the process steps are described as being performed in a stated order, particular process steps may be performed at different points in the process flow and in a different order with respect to other process steps as desired to achieve a similar resulting structure. In addition, one or more process steps can be substituted with alternative process steps that can also achieve a similar resulting structure. For example, the process steps of depositing a blanket layer of a gate metal and removing portions of the deposited gate metal from selected areas can be substituted with a process of selectively depositing the gate metal layer such that it is not deposited in the selected areas.

FIGS. 1-6 illustrate an exemplary baseline process where: all the FETs are non-DDC FETs; all the NFET gate stacks use a first common structure; all the PFET gate stacks use a second common structure; and the first and second common structures are different from each other. FIGS. 1-3 and 7-8 illustrate an exemplary process in which: DDC and non-DDC FETs are both present in an integrated circuit; and both the DDC-NFET and the DDC-PFET use the same gate stack structure as the non-DDC-PFET. FIGS. 1-3 and 9-10 illustrate another exemplary process in which: DDC and non-DDC FETs are both present in an integrated circuit, and both the DDC-NFET and the DDC-PFET use the same gate stack structure as the non-DDC-NFET. FIGS. 1-2 and 11-15 illustrate a further exemplary process in which: DDC and non-DDC FETs are both present in an integrated circuit; both the DDC-NFET and the DDC-PFET use the same gate stack structure as each other; and the gate stack of the DDC FETs is different from either the NFET gate stack or the PFET gate stack.

Figure 2:
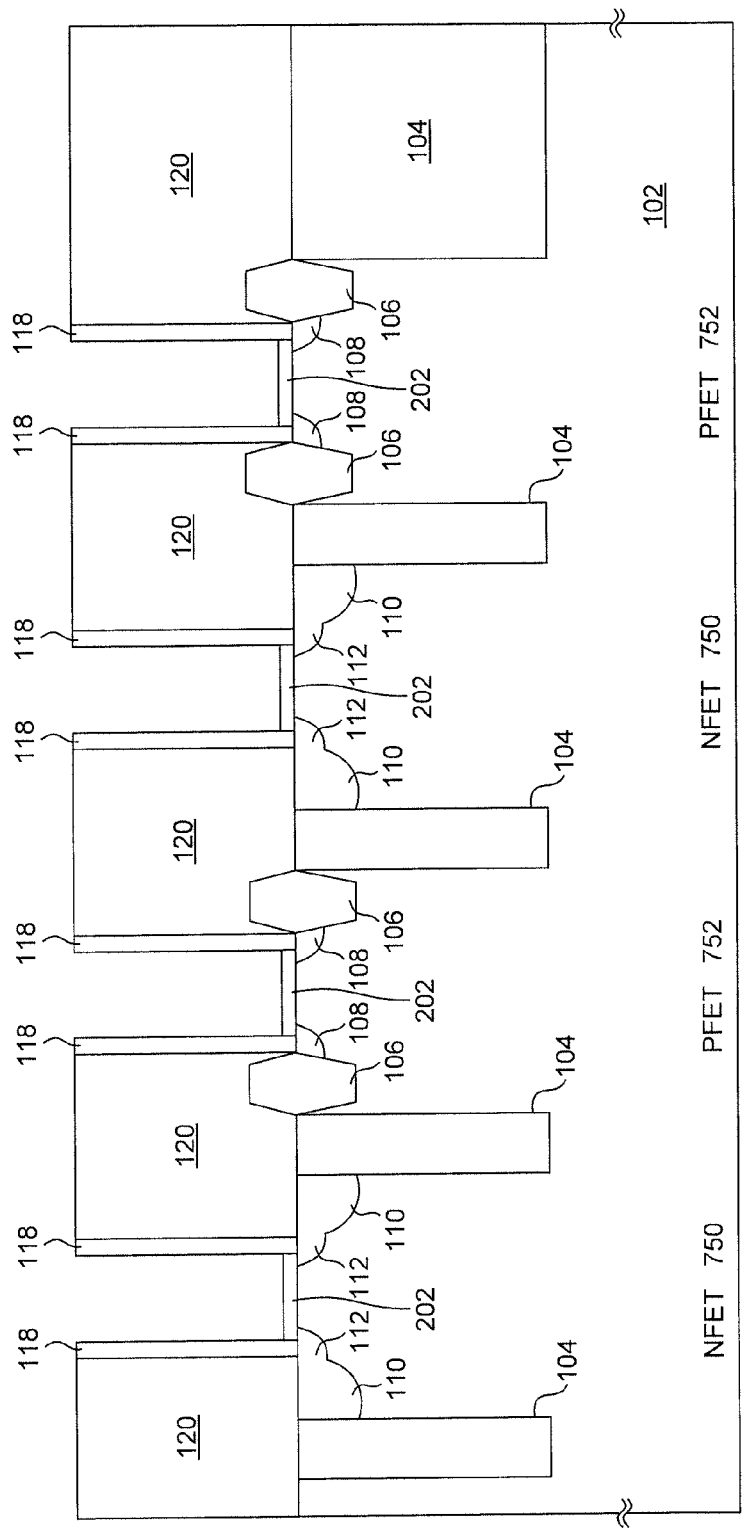
FIG. 2 shows the structure of FIG. 1 after a dummy gate stack has been removed and a high-k gate dielectric is formed on the surface exposed by removal of the dummy gate stack.
Figure 3:
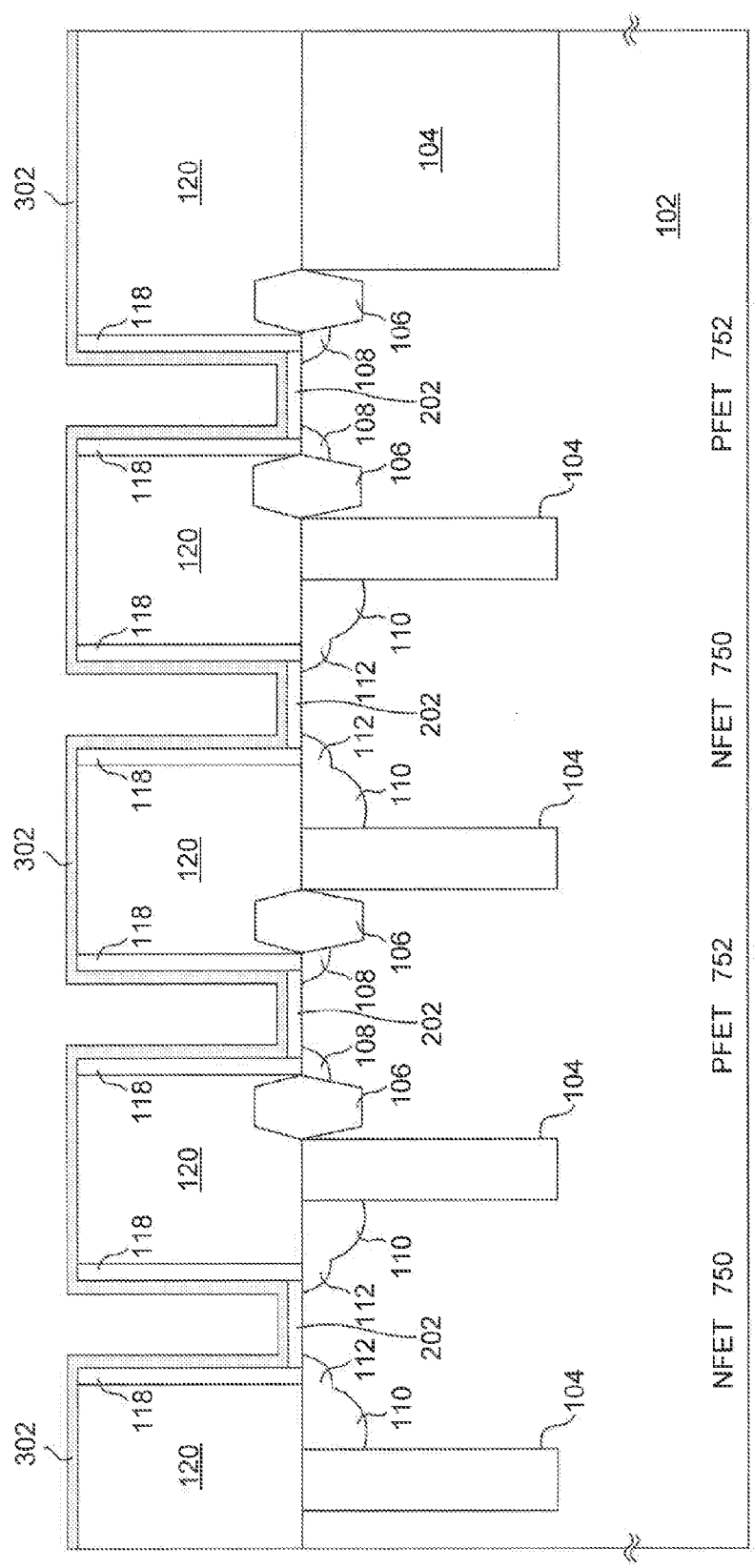
FIG. 3 shows the structure of FIG. 2 after deposition of a blanket layer of tantalum nitride (TaN).

It is noted that the structures shown in FIGS. 7-15 include DDC channel foundations for a DDC-NFET and a DDC-PFET. When referred to in combination with FIGS. 7-15, the illustrative cross-sectional representations of FIGS. 1-3 are understood to include the DDC channel foundations shown in FIGS. 7-15, since those figures and the process steps involved are the same except for the formation of the DDC channel foundation, which is described and shown in U.S. patent application Ser. No. 13/459,971, filed 30 Apr. 2012, titled "Multiple Transistor Types Formed in a Common Epitaxial Layer by Differential Out-Diffusion From a Doped Underlayer (incorporated by reference above).

Unless otherwise stated, the figures are representative and not drawn to scale. Those skilled in the art of semiconductor manufacturing readily understand the meaning of such cross-sectional representative figures.

Table 1, shown below, illustrates various non-limiting combinations of channel foundation structures and combinations of gate stack materials.

TABLE 1

|  | NFET (non-DDC) Channel Foundation | PFET (non-DDC) Channel Foundation | NFET (DDC) Channel Foundation | PFET (DDC) Channel Foundation |
| --- | --- | --- | --- | --- |
| Gate Stack Combo | Gate Stack 1 | Gate Stack 2 | | |
| Gate Stack Combo | Gate Stack 1 | Gate Stack 2 | Gate Stack 2 | Gate Stack 2 |
| Gate Stack Combo | Gate Stack 1 | Gate Stack 2 | Gate Stack 1 | Gate Stack 1 |
| Gate Stack Combo | Gate Stack 1 | Gate Stack 2 | Gate Stack 3 | Gate Stack 3 |

Illustrative Gate Stack 1 includes: a high-k gate dielectric layer, typically hafnium oxide (HfO); a layer of tantalum nitride (TaN) disposed on the inner surfaces of a sidewall spacer structure, and further disposed over the high-k gate dielectric layer; a layer of TiN disposed over the TaN layer; and a layer of aluminum (Al) disposed over the TaN.

Illustrative Gate Stack 2 includes: a high-k gate dielectric layer, typically hafnium oxide (HfO); a layer of TiN disposed on the inner surfaces of a sidewall spacer structure, and further disposed over the high-k gate dielectric layer; and a layer of Al disposed over the $TiN_x$.

Illustrative Gate Stack 3 includes: a high-k gate dielectric layer, typically hafnium oxide (HfO); a layer of $TiN_x$ disposed on the inner surfaces of a sidewall spacer structure, and further disposed over the high-k gate dielectric layer; a layer of TiN disposed over the $TiN_x$; and a layer of Al disposed over the TiN.

It is noted that those skilled in the art and having the benefit of this disclosure will be able to select materials and their respective thicknesses to achieve various desired sets of electrical properties. It is further noted that descriptions of particular metals associated with transistor types are provided to facilitate an understanding of similarities and differences in the gate stacks; but generally, it is understood by those skilled in the art that certain metal material combinations are selected to provide work functions desirable for NFET devices and PFET devices, whether such material combinations are achieved by the materials specified in this disclosure or not. The present invention is not limited to the exemplary gate stacks described above.

A baseline process is first described. Referring to FIG. 1, a cross-sectional representation of a portion of a wafer 102 having a partially fabricated integrated circuit thereon is shown. The partially fabricated integrated circuit of FIG. 1 show two NFETs 750 and two PFETs 752. More particularly, FIG. 1 shows: shallow trench isolation (STI) structures 104; PFETs 752 having silicon germanium (SiGe) raised S/Ds 106, source drain extensions (SDE) 108, dielectric layer 114, polysilicon gate 116, and sidewall spacers 118; NFETs 750 having S/Ds 110, SDEs 112, dielectric layer 114, polysilicon gate 116, and sidewall spacers 118; and a dielectric layer 120 deposited over the surface of wafer 102 and surrounding sidewall spacers 118. It is noted that sidewall spacers 118 are formed from dielectric material. It is noted that the SiGe raised S/Ds are sometimes referred to as embedded SiGe (e-SiGe) S/Ds. It is further noted that the present invention is not limited to implementation of PFETs using the raised S/D structures, nor limited to the use of SiGe in the PFET S/D structures. Those skilled in the art and having the benefit of the present disclosure will understand that other PFET S/D structures (e.g., planar and finFET) have been, and continue to be used in the semiconductor industry.

In some embodiments halo implants are performed to implant dopants into the channel regions of the NFETs and the PFETs. Such implants are typically performed to set the threshold voltage of the various transistors.

FIG. 2 shows the structure of FIG. 1 after the dummy gate stack (i.e., polysilicon 116, and dielectric layer 114) has been removed from each transistor, and a high-k gate dielectric 202 is formed on the surface exposed by the removal of the dummy gate stack. Any suitable etch chemistry may be used to remove the dummy gate stack. In typical embodiments, high-k gate dielectric 202 is hafnium oxide, but the present invention is not limited to gate dielectric layers having any particular chemical composition. Further the present invention is not limited to gate dielectric layers having a uniform chemical make-up. Still further, the present invention comprehends the use of gate dielectric structures in the form of laminates, i.e., two or more layers each having a different chemical composition. Additionally, there may be an interfacial silicon oxide layer (not shown) having a thickness on the order of five angstroms disposed between wafer 102 and gate dielectric layer 202.

FIG. 3 shows the structure of FIG. 2 after deposition of a blanket layer of tantalum nitride (TaN) 302. An atomic layer deposition (ALD) technique is typically used to deposit TaN 302, but any suitable equipment and process conditions may be used, and the present invention is not limited to the particulars of the deposition process.

Figure 4:
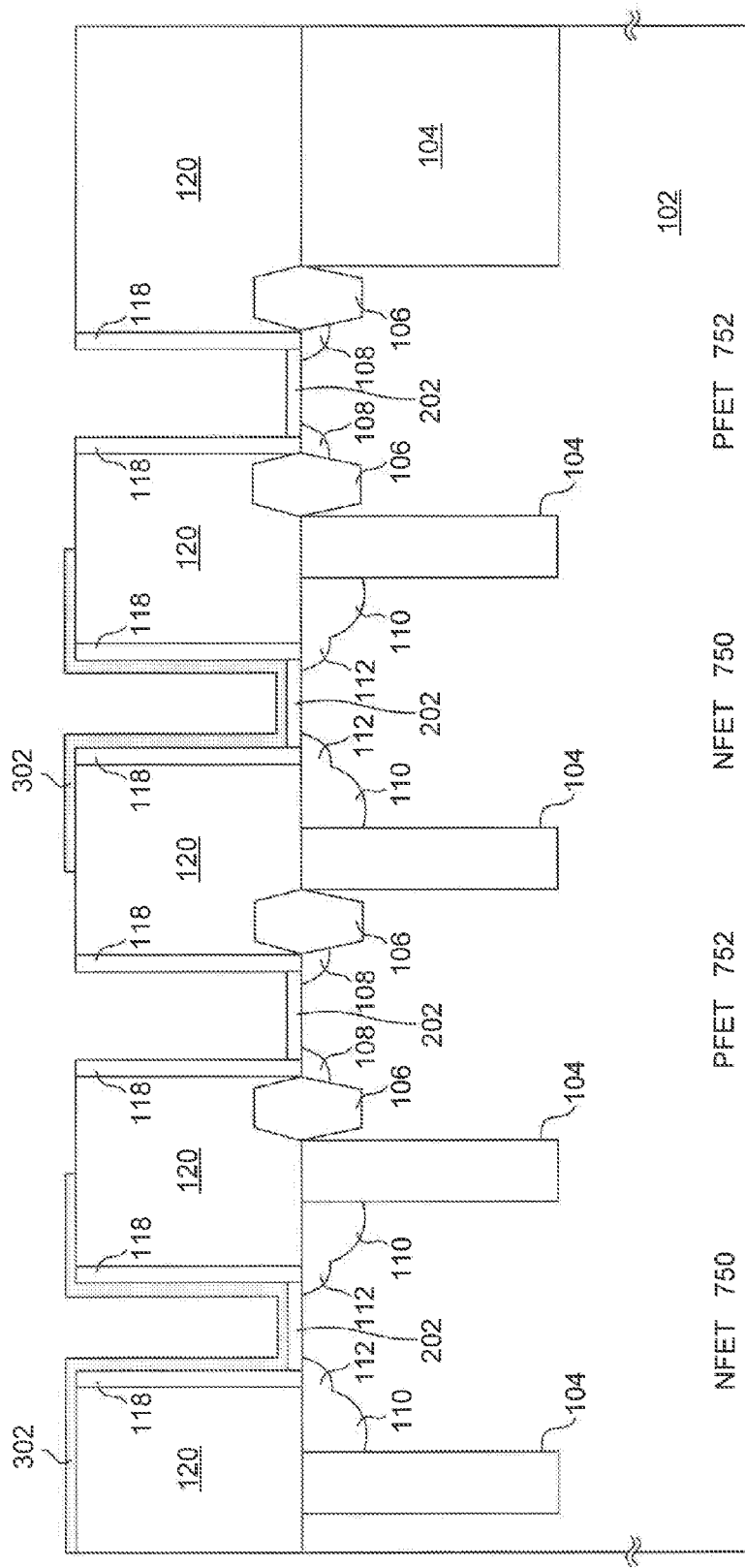
FIG. 4 shows the structure of FIG. 3 after selected portions of the TaN are removed from PFET areas of the integrated circuit, but remains in NFET gate stacks areas.

FIG. 4 shows the structure of FIG. 3 after selected portions of TaN layer 302 are removed such that TaN is removed from the PFET 752 areas of the integrated circuit, but remains in the NFET 750 gate stacks.

Figure 5:
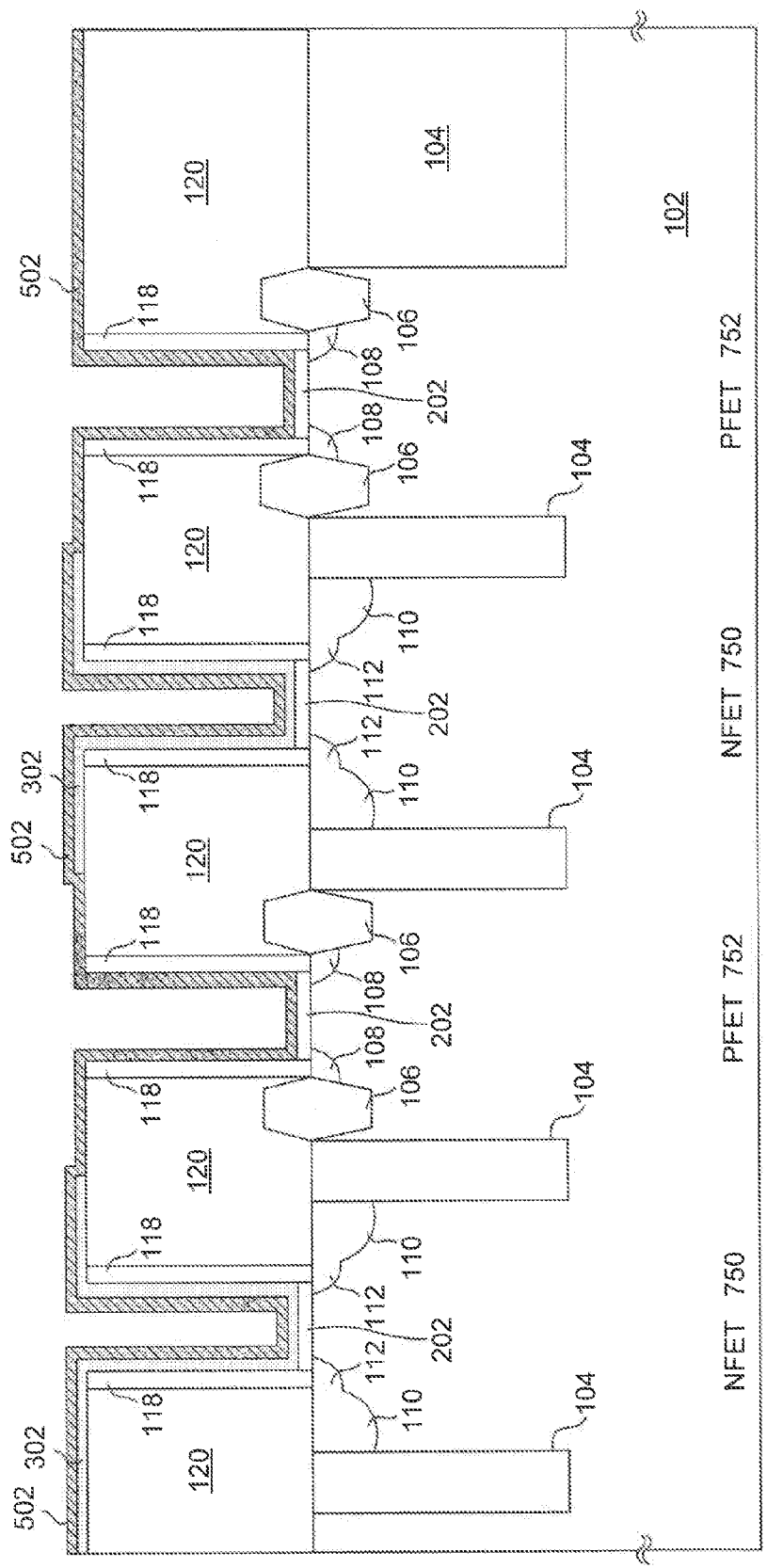
FIG. 5 shows the structure of FIG. 4 after deposition of a blanket layer of titanium nitride (TiN).

FIG. 5 shows the structure of FIG. 4 after deposition of a blanket layer of titanium nitride (TiN) 502. As can be seen in FIG. 5, TiN layer 502 covers TaN 302, and the exposed portions of dielectric layer 120, sidewall spacers 118, and gate dielectric layer 202. The thicknesses of TaN 302 and TiN 502 are selected to provide the desired work function. It is noted that the invention is not limited to any particular method of achieving the desired thicknesses of any materials. It is particularly noted that setting the work function of the gate stack by means of thickness (i.e., not just material selection) can be achieved in any suitable manner including but not limited to controlling the deposition process, or by depositing a greater thickness than desired and the etching back the excess amount of material.

Figure 6:
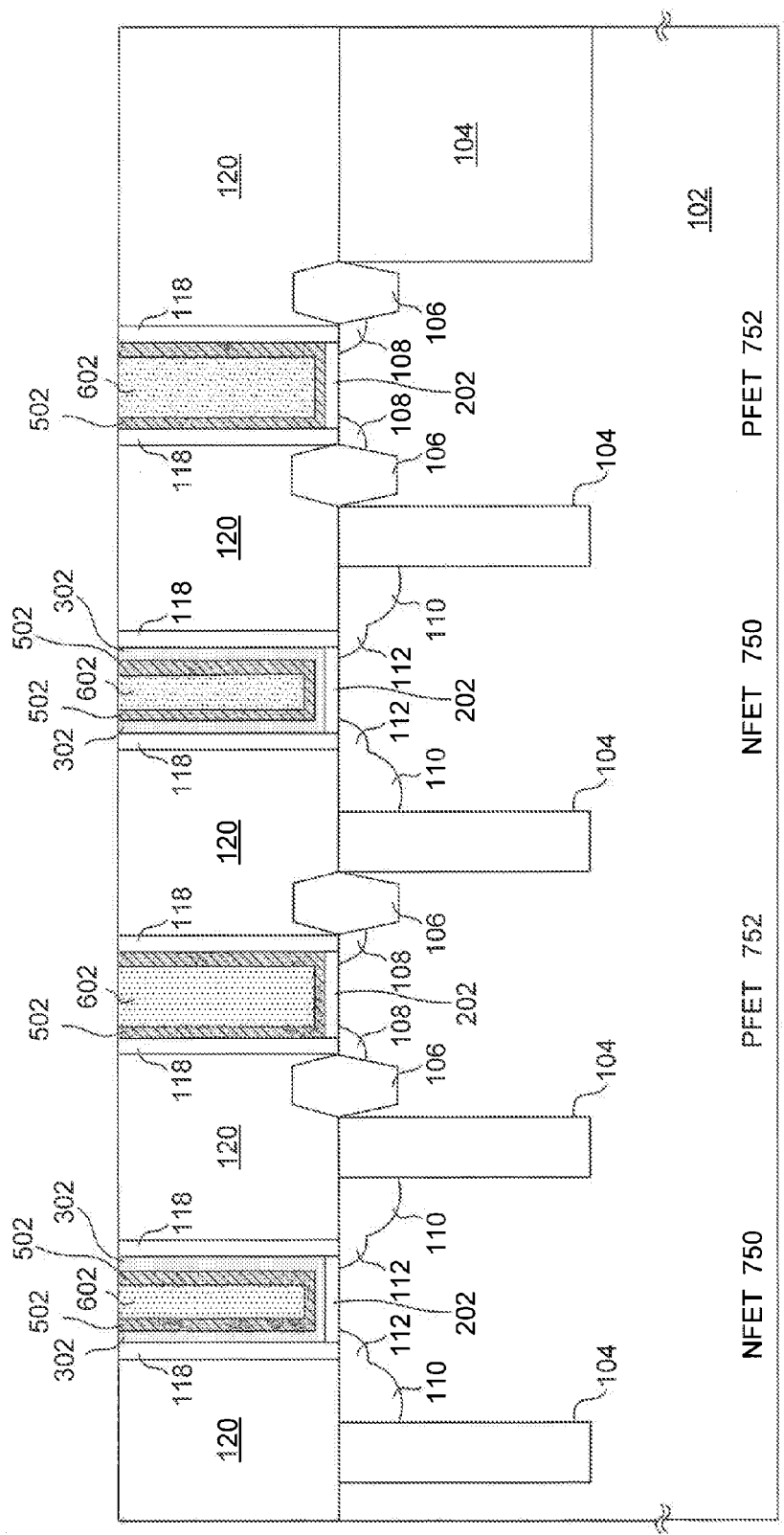
FIG. 6 shows the structure of FIG. 5 after a chemical mechanical polishing (CMP) operation has removed the excess Al, TiN and TaN from the upper surface of a dielectric layer surrounding the gate stack/spacer structures.

FIG. 6 shows the structure of FIG. 5 after a chemical mechanical polishing operation has removed the excess TiN and TaN from the upper surface of dielectric layer 120, and the gate stacks are completed with an aluminum filling. The baseline process shows two NFETs 750 each having a gate stack comprised of a hafnium oxide gate dielectric 202, TaN 302, TiN 502, and Al 602; and two PFETs 752 each having a gate stack comprised of a hafnium oxide gate dielectric 202, TiN 502, and Al 602.

Figure 7:
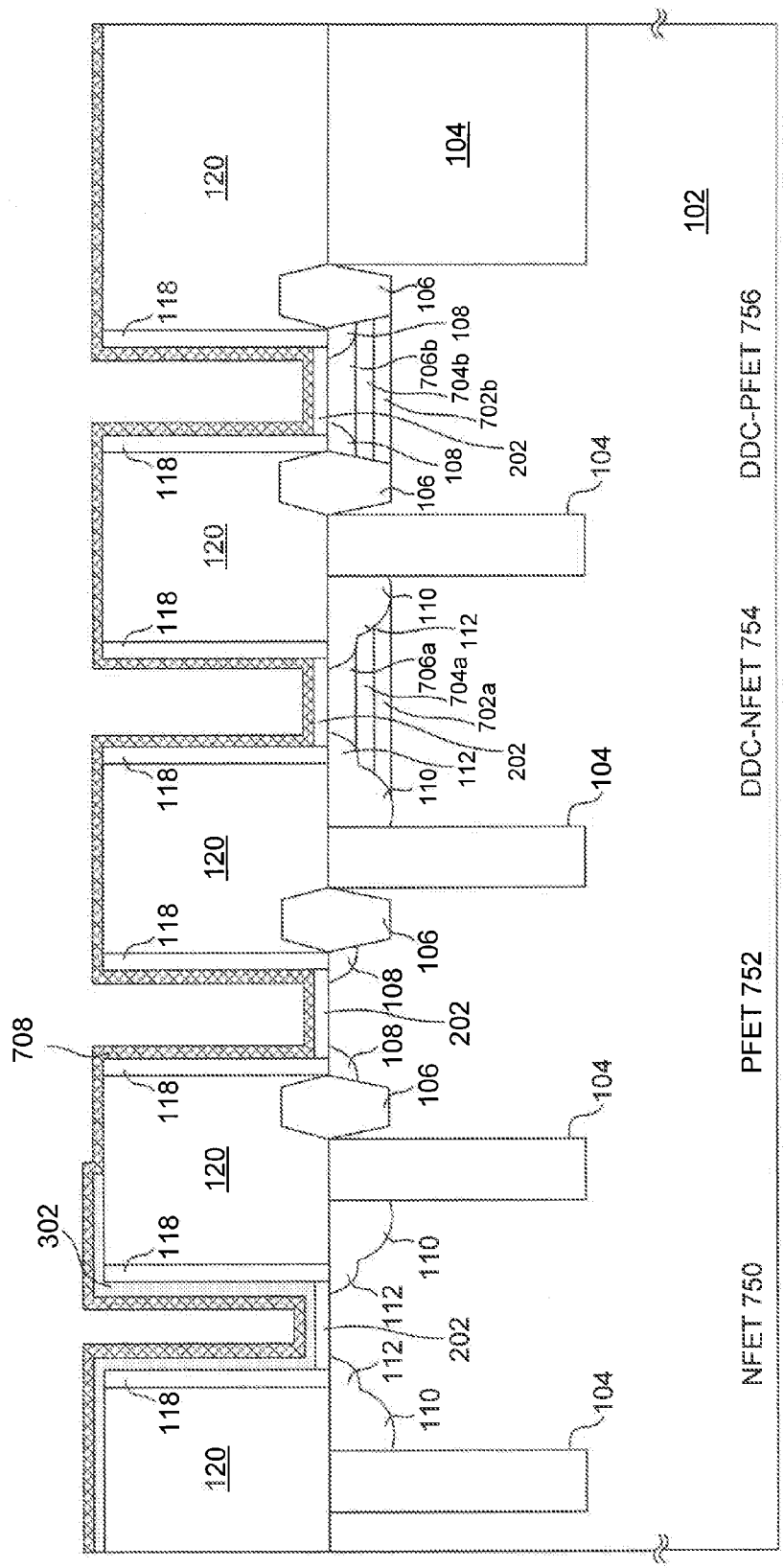
FIG. 7 is similar to the structure of FIG. 3, except Deeply Depleted Channel (DDC) channel foundations are provided for a portion of the NFETs and PFETs, and after selected portions of the blanket layer of TaN are removed such that TaN is removed from the PFET, DDC-NFET, and DDC-PFET areas of the integrated circuit, but remains in the NFET gate stack; and after the deposition of a blanket layer of TiN.

FIG. 7 is similar to the structure of FIG. 3, except modified to show DDC channel foundations provided for a portion of the NFETs and PFETs. FIG. 7 shows modified FIG. 3 after selected portions of TaN layer 302 are removed such that TaN is removed from the PFET 752, DDC-NFET 754, and DDC-PFET 756 areas of the integrated circuit, but remains in the NFET 750 gate stack; and after the deposition of a blanket layer of TiN 708. Referring again to the DDC channel foundations, DDC-NFET 754 includes an undoped region 706a disposed subjacent high-k gate dielectric layer 202, a threshold adjustment region 704a disposed subjacent region 706a, and a screening region 702a disposed subjacent threshold adjustment region 704a. DDC-PFET 756 includes an undoped region 706b disposed subjacent high-k gate dielectric layer 202, a threshold adjustment region 704b disposed subjacent region 706a, and a screening region 702b disposed subjacent threshold adjustment region 704b.

It is noted that although various materials are referred to as being "deposited," any suitable equipment and process steps may be used to dispose the materials as indicated herein.

Figure 8:
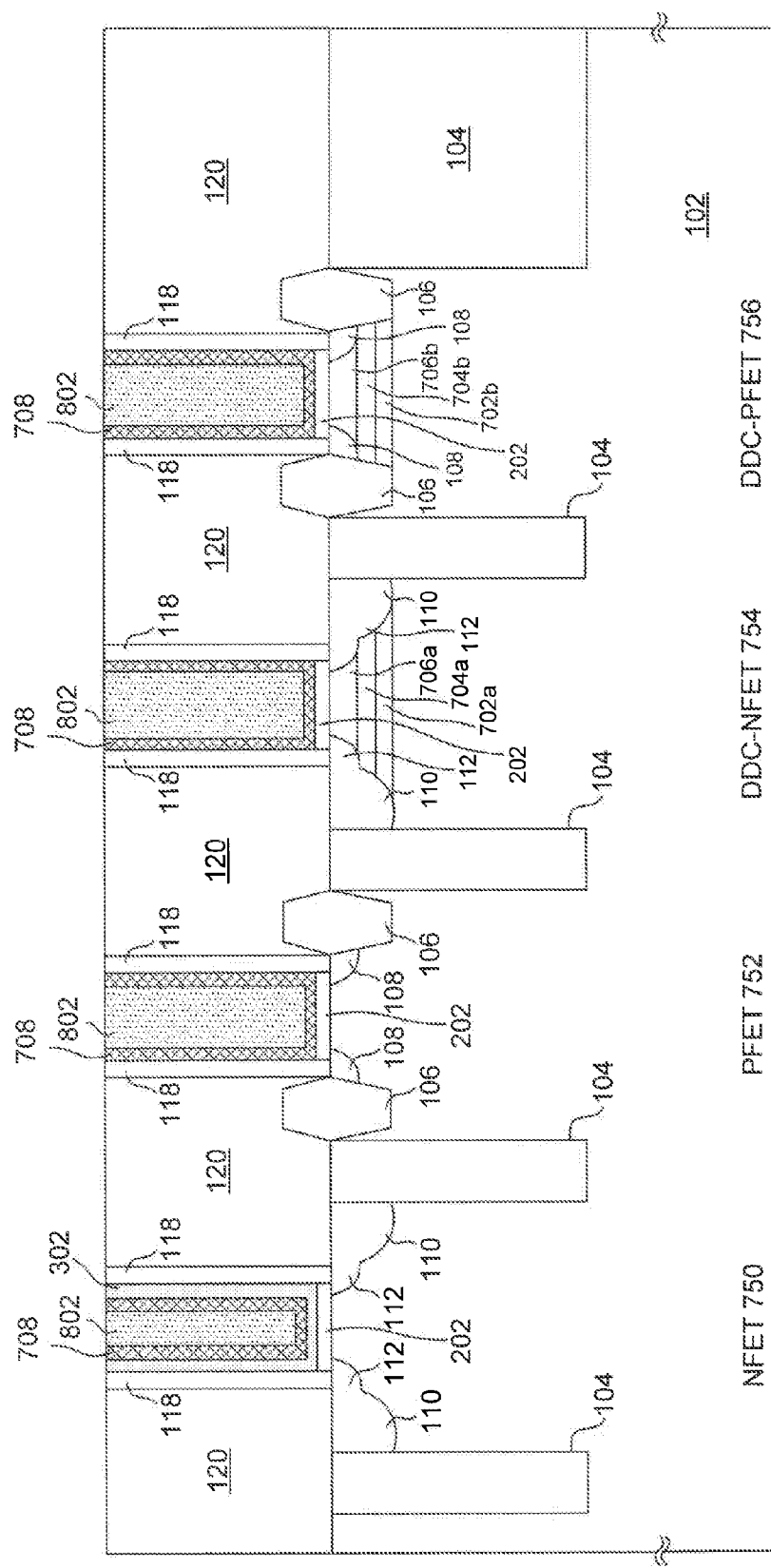
FIG. 8 shows the structure of FIG. 7 after deposition of an Al fill in the gate stacks and after a chemical mechanical polishing operation has removed the excess TiN and TaN from the upper surface of a dielectric layer surrounding the gate stack/spacer structures.

FIG. 8 shows the structure of FIG. 7 after deposition of Al 802 to fill in the gate stacks and after a chemical mechanical polishing operation has removed the excess TiN and TaN from the upper surface of dielectric layer 120. FIG. 8 illustrates a process and structure in which NFETs and PFETs (750 and 752 respectively), together with DDC-NFETs and DDC-PFETs (754 and 756 respectively), are integrated within an integrated circuit. It is noted that only two gate stack structures are used amongst the four types of transistor structures (i.e., the NFET, PFET, DDC-NFET, and DDC-PFET each have a different channel foundation). In this illustrative embodiment, a single type of gate stack is used for PFET 752, DDC-NFET 754, and DDC-PFET 756, while a separate type of gate stack is used for NFET 750.

Figure 9:
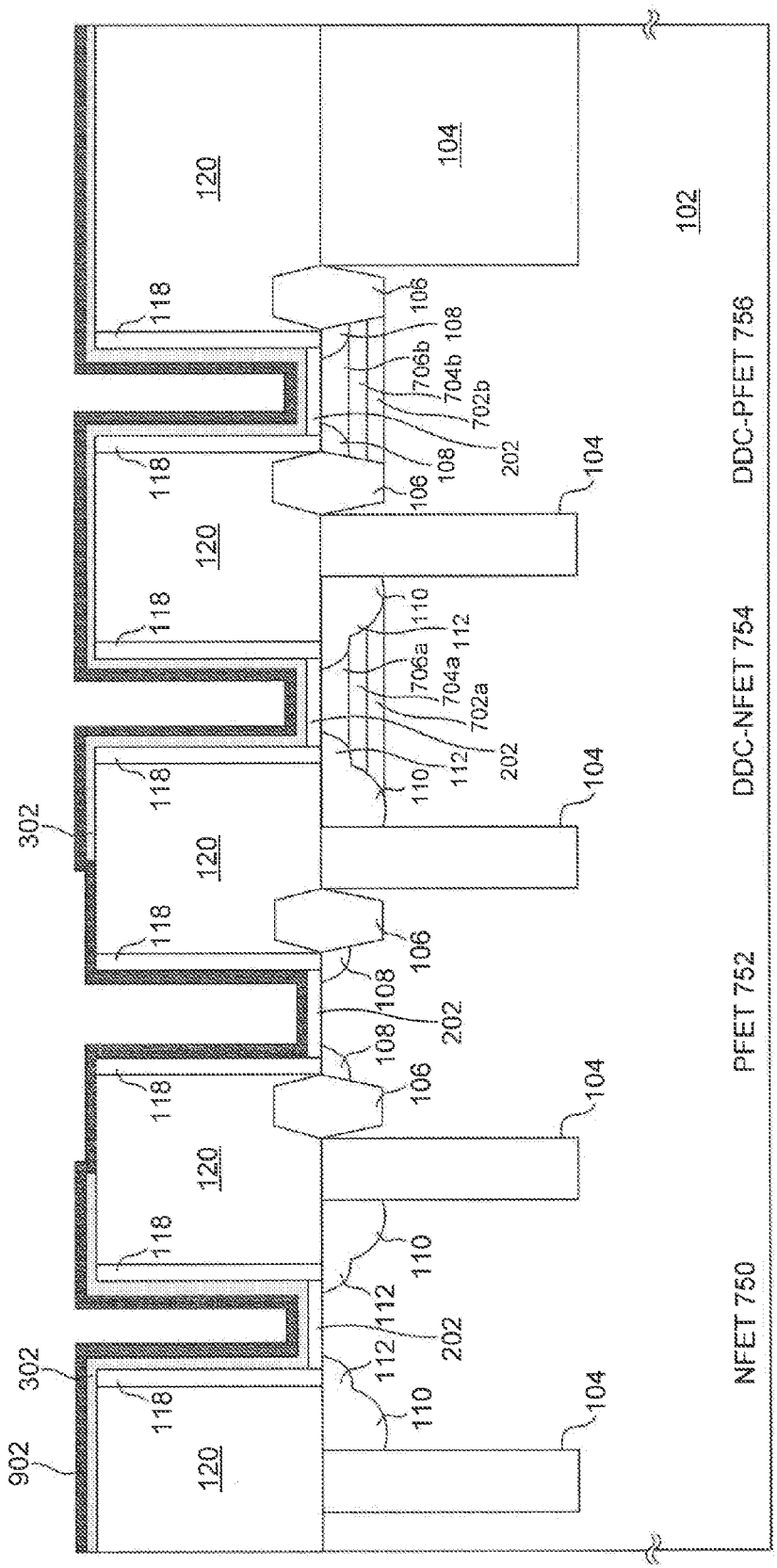
FIG. 9 is similar to the structure of FIG. 3, except DDC channel foundations are provided for a portion of the NFETs and PFETs, and after selected portions of the blanket layer of TaN are removed such that TaN is removed from the PFET areas of the integrated circuit, but remains in the NFET, DDC-NFET and DDC-PFET gate stacks.

FIG. 9 is similar to the structure of FIG. 3, except DDC channel foundations are provided for a portion of the NFETs and PFETs, and after selected portions of TaN layer 302 are removed such that TaN is removed from the PFET 752 areas of the integrated circuit, but remains in the NFET 750, DDC-NFET 754 and DDC-PFET 756 gate stacks, and a blanket layer of TiN 902 is deposited.

Figure 10:
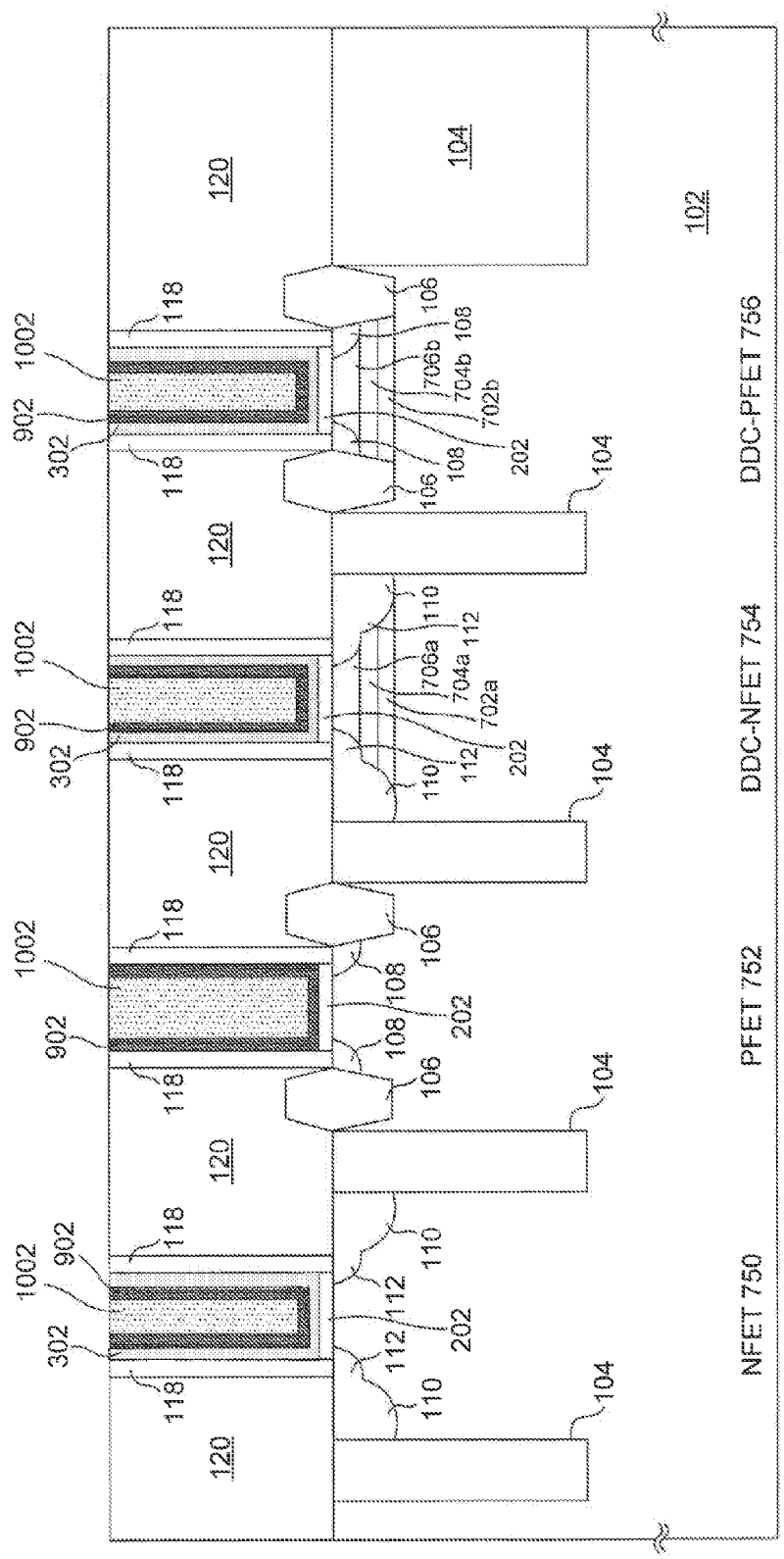
FIG. 10 shows the structure of FIG. 9 after deposition of an Al fill in the gate stacks and after a chemical mechanical polishing operation has removed the excess TiN and TaN from the upper surface of a dielectric layer surrounding the gate stack/spacer structures.

FIG. 10 shows the structure of FIG. 9 after deposition of Al 1002 to fill in the gate stacks and after a chemical mechanical polishing operation has removed the excess TiN and TaN from the upper surface of dielectric layer 120, which surrounds the gate stack/spacer structures. It is noted that only two gate stack structures are used amongst the four types of transistor structures. In this illustrative embodiment, a single type of gate stack is used for NFET 750, DDC-NFET 754, and DDC-PFET 7565, while a separate type of gate stack is used for PFET 752.

Figure 11:
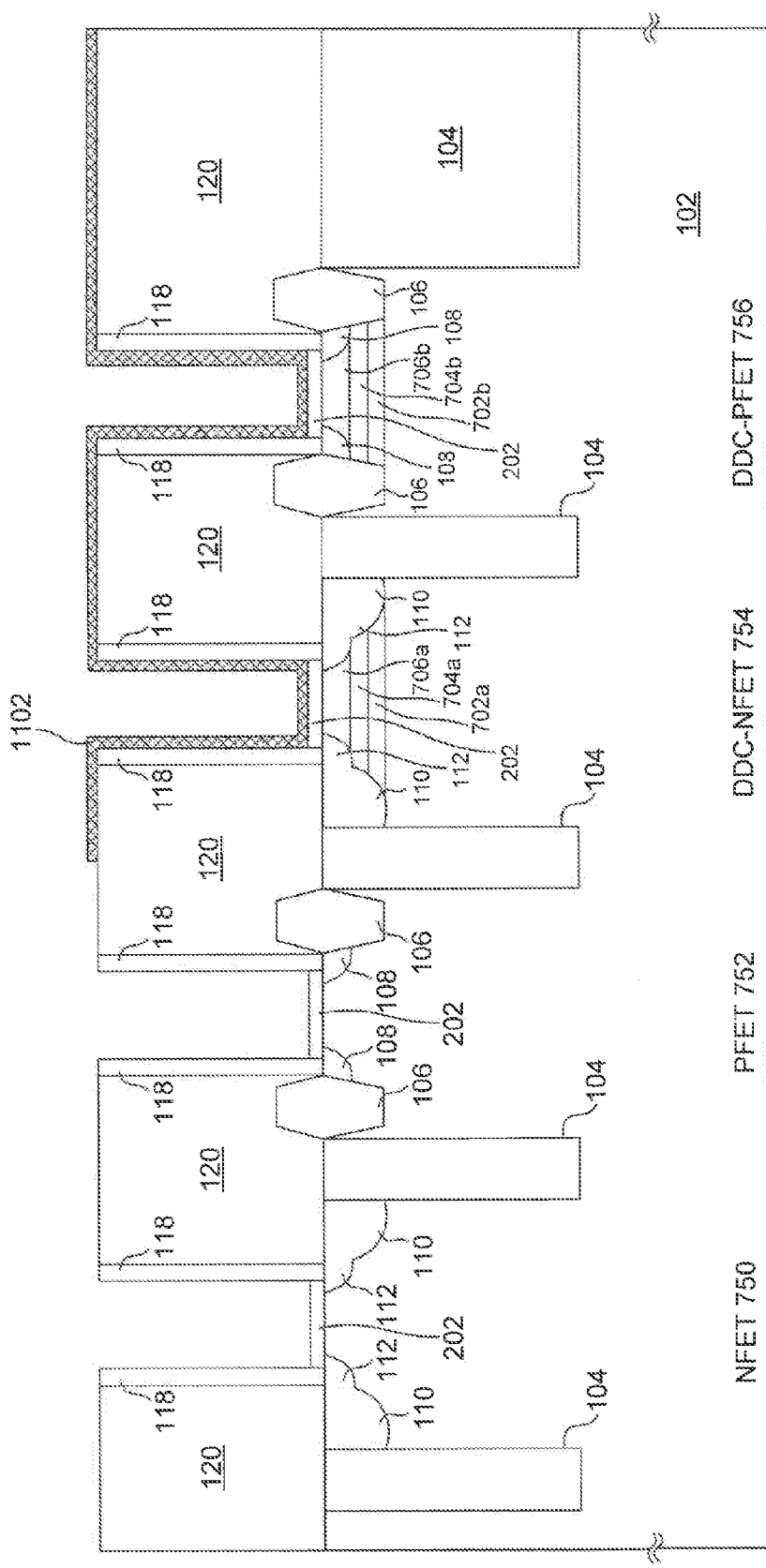
FIG. 11 is similar to the structure of FIG. 2, except DDC channel foundations are provided for a portion of the NFETs and PFETs, and after deposition of a blanket layer of $TiN_x$, removal of selected portions of the $TiN_x$ such that $TiN_x$ is removed from the NFET and PFET areas, but remains in the DDC-NFET and DDC-PFET gate stacks.

FIG. 11 is similar to the structure of FIG. 2, except DDC channel foundations are provided for a portion of the NFETs and PFETs, and after deposition of a blanket layer of $TiN_x$, a stoichiometric variance of TiN which can modulate the transistor work function, removal of selected portions of the $TiN_x$ blanket layer such that $TiN_x$ is removed from the NFET 750 and PFET 752 areas, but remains in the DDC-NFET 754 and DDC-PFET 756 gate stacks, thus forming patterned $TiN_x$ layer 1102.

Figure 12:
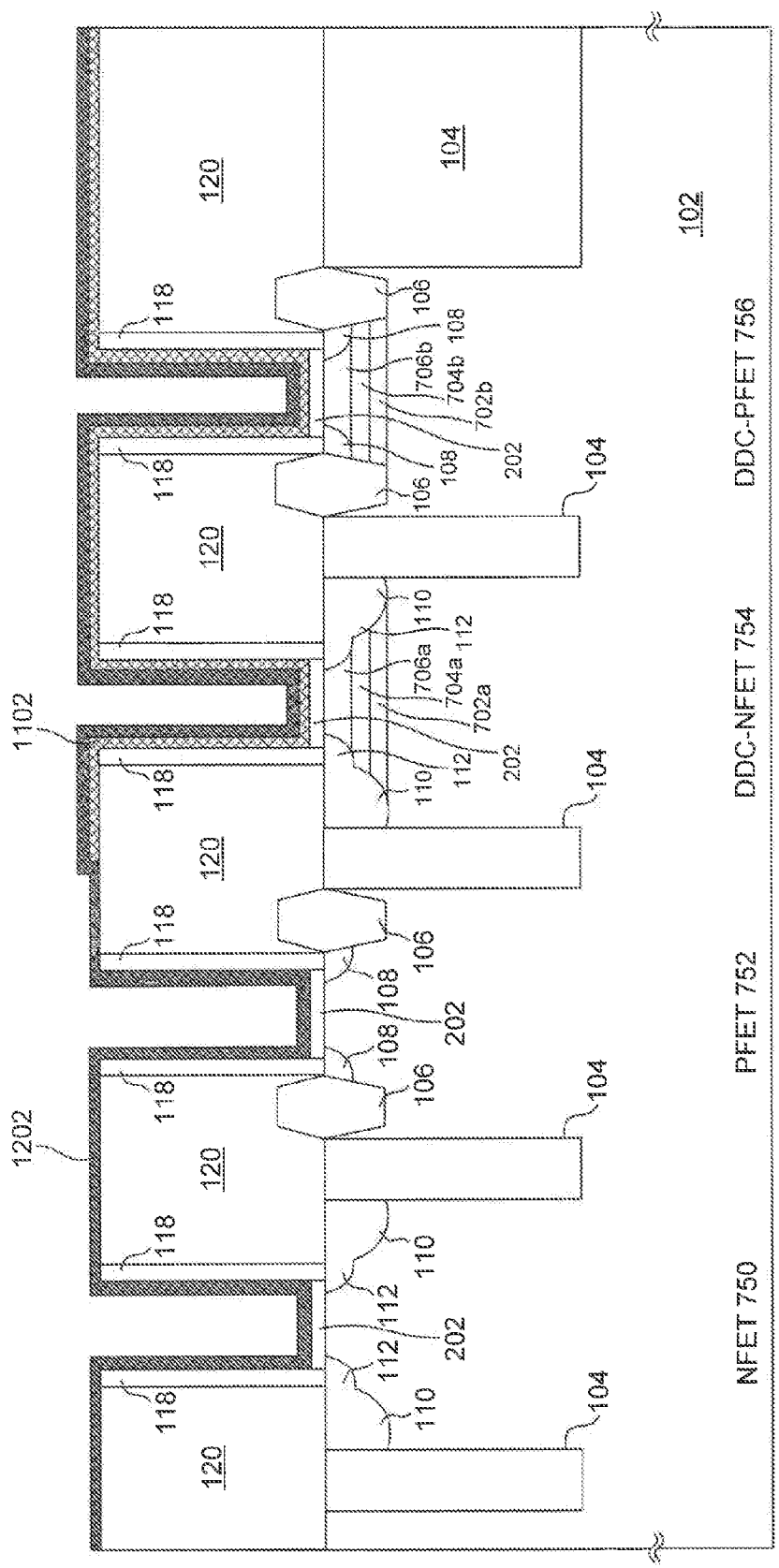
FIG. 12 shows the structure of FIG. 11 after deposition of a blanket layer of TaN.

FIG. 12 shows the structure of FIG. 11 after deposition of a blanket layer of TaN 1202.

Figure 13:
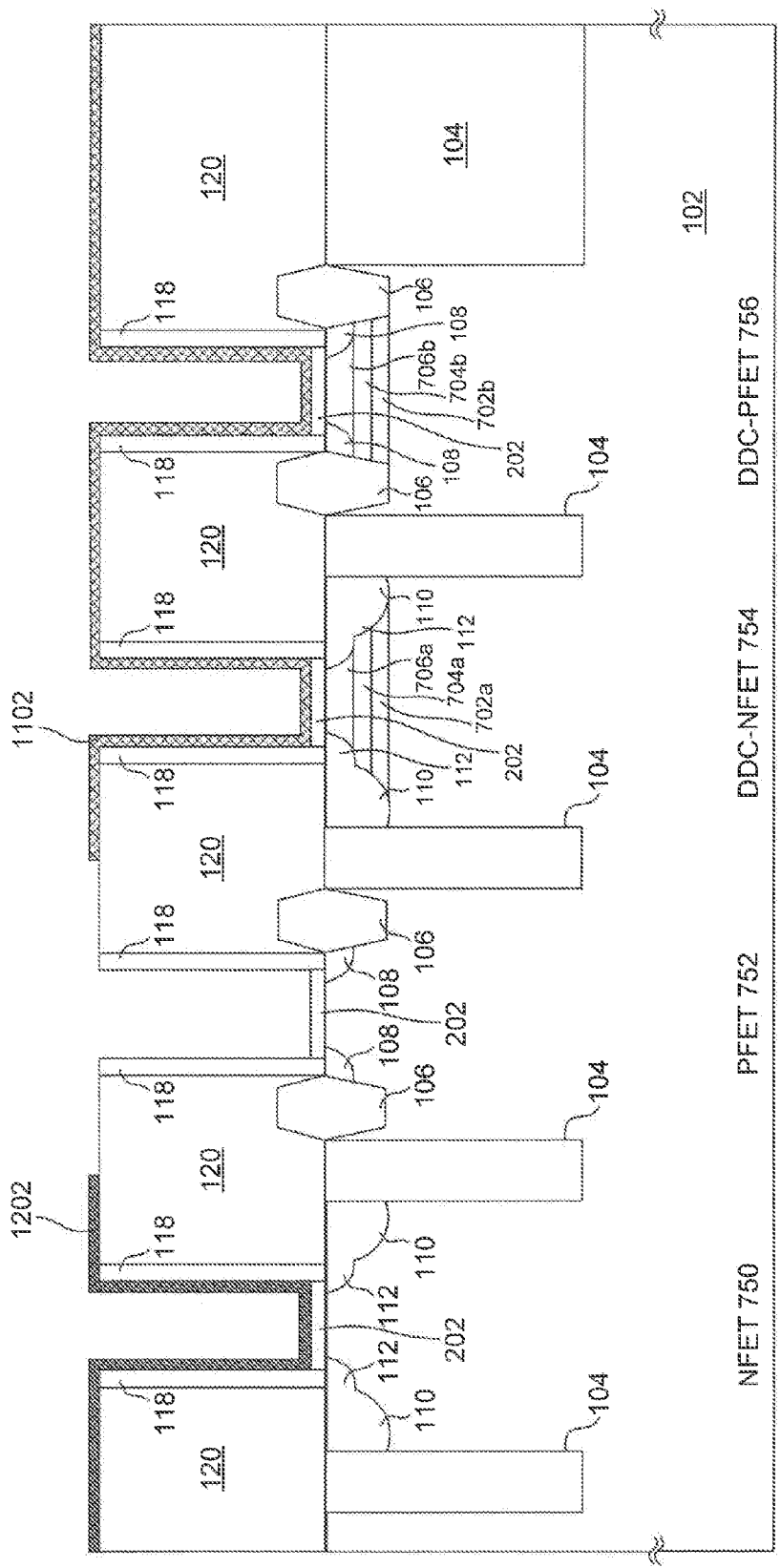
FIG. 13 shows the structure of FIG. 12 after selected portions of the TaN blanket layer have removed such that TaN is removed from the PFET, DDC-NFET and DDC-PFET areas, but remains in the NFET gate stack.

FIG. 13 shows the structure of FIG. 12 after selected portions of TaN 1202 have removed such that TaN is removed from the PFET 752, DDC-NFET 754 and DDC-PFET 756 areas, but remains in the NFET 750 gate stack.

Figure 14:
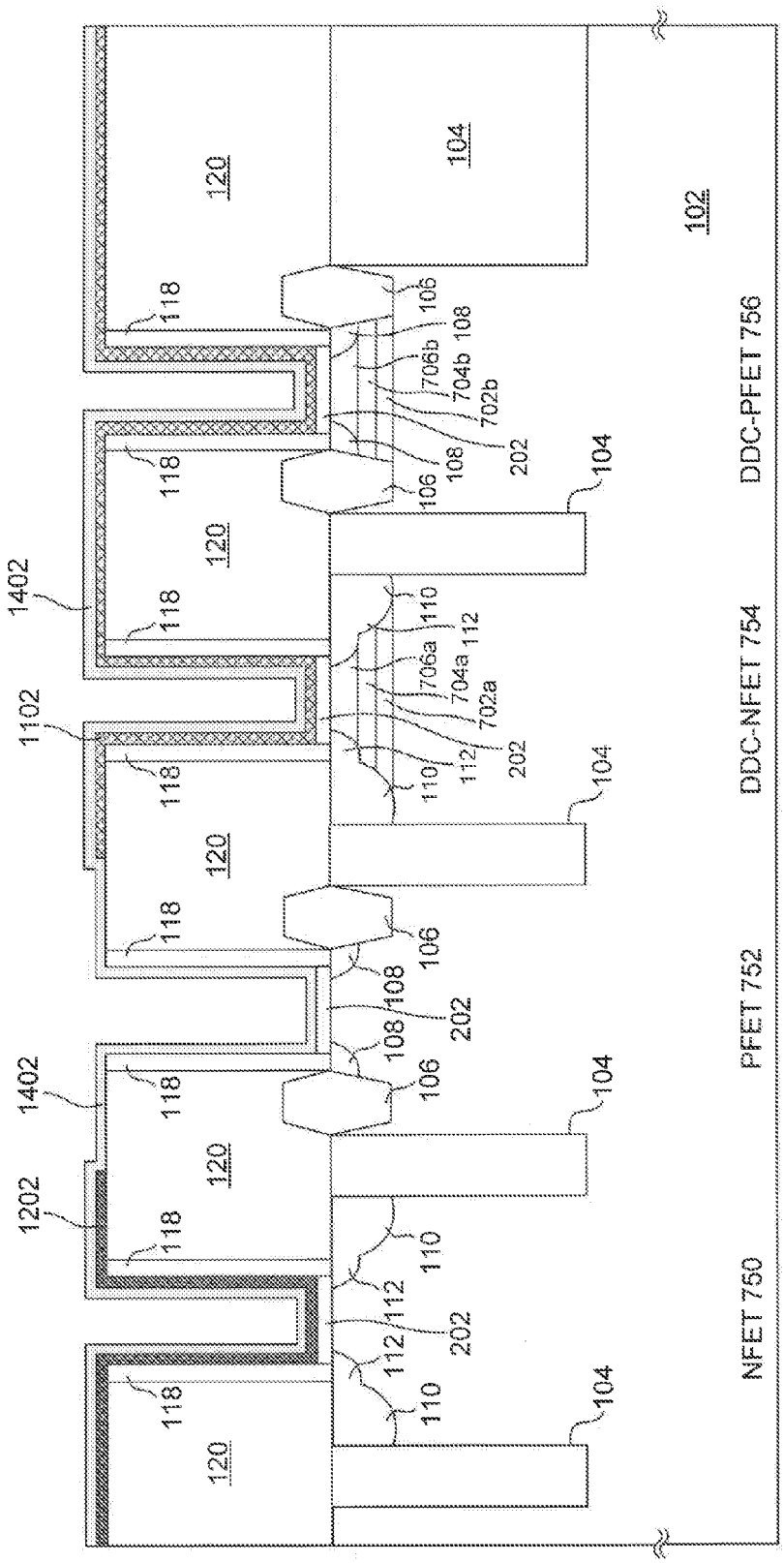
FIG. 14 shows the structure of FIG. 13 after deposition of a blanket layer of TiN.

FIG. 14 shows the structure of FIG. 13 after deposition of a blanket layer of TiN 1402.

Figure 15:
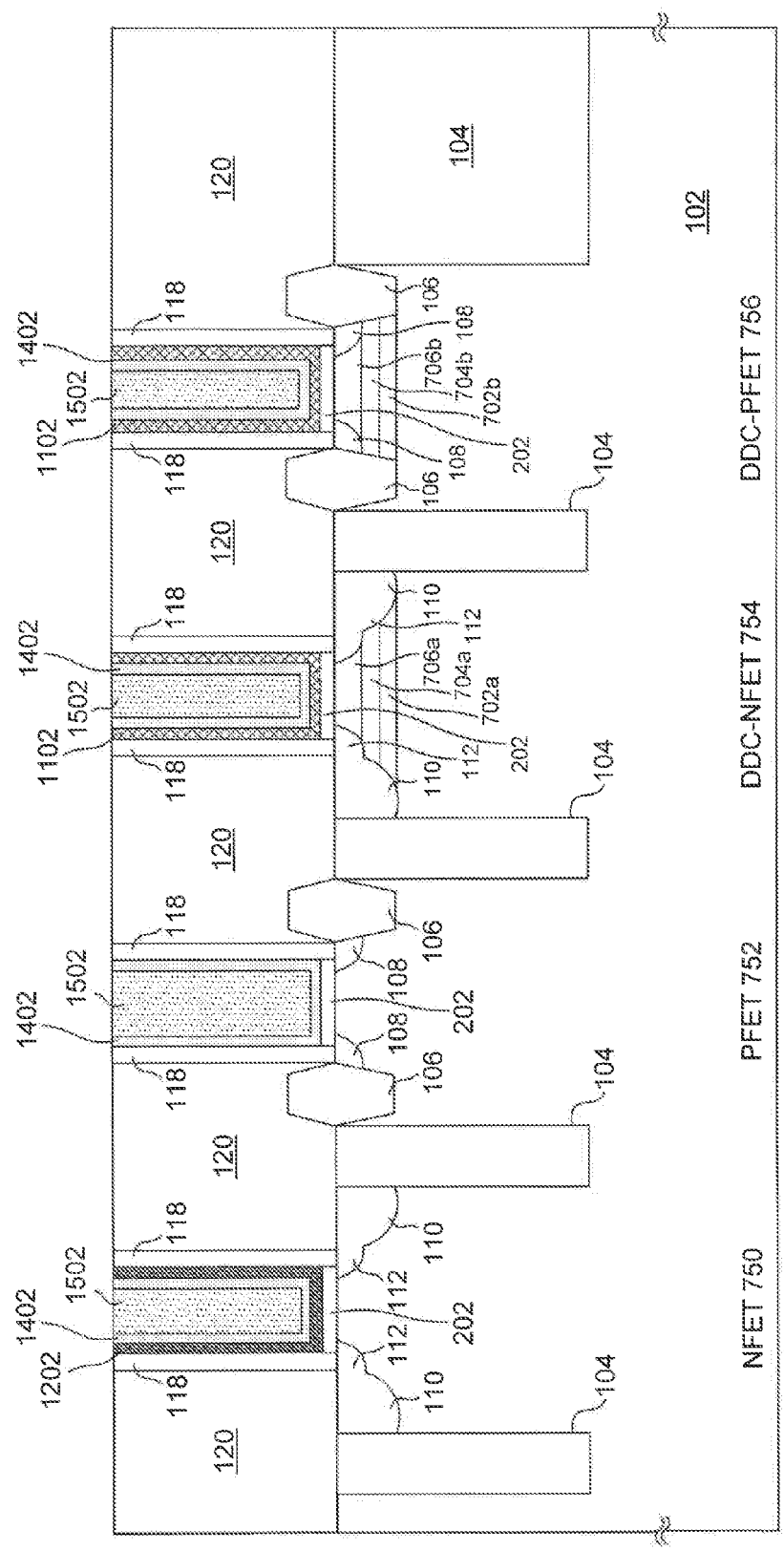
FIG. 15 shows the structure of FIG. 14 after deposition of an Al fill in the gate stacks and removal of the excess TiNx, TaN and TiN from the upper surface of a dielectric layer surrounding the gate stack/spacer structures.

FIG. 15 shows the structure of FIG. 14 after deposition of Al 1502 to fill in the gate stacks, and removal of the excess TiNx, TaN and TiN from the upper surface of dielectric layer 120. The resulting structures are discussed below.

It is noted that conventional processing for metallization and via formation may be performed to complete the integrated circuit subsequent to the completion of the gate stacks.

Figure 16:
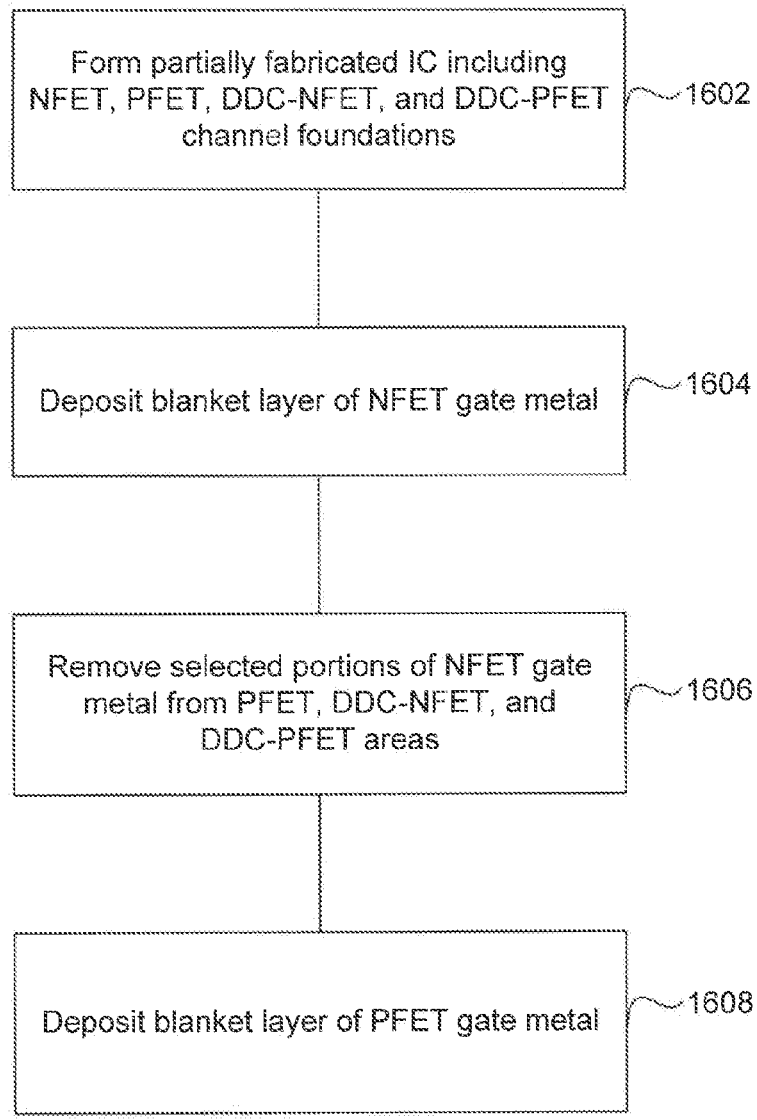
FIG. 16 is a flow diagram of an exemplary manufacturing process for formation of transistor metal gate stacks in a "gate first" sequence.

Even though various process and structure embodiments are described above with reference to re-using gate metals in a gate last process, such gate metal re-use is also applicable to a gate first process. For example, FIG. 16 shows a gate first process flow 1600 that re-uses the PFET non-DDC gate metal for the DDC-NFET and DDC-PFET transistors. At step 1602, the integrated circuit is partially fabricated in that the NFET, PFET, DDC-NFET and DDC-PFET channel foundations are established, including the formation of a blanket epitaxial layer after doping the channel regions. Then, the gate foundation is patterned so that the metal portions can be formed. For the metal portions, first, in the example at 1600, an NFET gate metal is deposited across the surface of the patterned gate foundation 1604. Then, selected portions of NFET gate metal are removed from the PFET, DDC-NFET and DDC-PFET areas 1606. Then, a layer of PFET gate metal is deposited across the surface of the patterned gate foundation 1608. Note that an alternative gate first process flow can re-use the non-DDC NFET gate metal for both the DDC-NFET and DDC-PFET transistors. Alternative gate first process flows can use either one or two DDC gate metals having work functions selected to meet threshold voltage requirements for the device, wherein the selected metal may be of the same work function as one of the non-DDC transistors or may be of a different work function.

In either a gate-first process or a gate-last process, the selected DDC gate metal can be used for both the DDC-NFET and DDC-PFET transistors, which may be the same metal as used for the NFET or PFET transistor or may be an alternative metal stack from either NFET or PFET transistors, or, a first metal can be selected for the DDC-NFET transistor and a second metal can be selected for the DDC-PFET transistor, which metal selections may match those used for the NFET and PFET. To achieve different work functions, different metal materials or composites may be used, or the work functions of one or more of the already deposited gate metals (e.g., the non-DDC NFET and/or PFET gate metals, or the one or more DDC gate metals) can be adjusted using techniques such as alloying, ion implantation, post-deposition treatment, thickness adjustment, etc. Techniques for adjusting the metal gate work function using thickness adjustment can also include adjusting the gate metal thickness using selective etch-back, such as performing selective etch-back to adjust the thickness of a first type of gate metal before depositing a second type of gate metal over the first type gate metal.

Structure

FIG. 8, discussed above in connection with an illustrative process flow, shows the structure of a partially fabricated integrated circuit in which an NFET 750 and a PFET 752, each having a conventional channel foundation, are formed on the same die as a DDC-NFET 754 and a DDC-PFET 756, each having the DDC channel foundation. In this embodiment there are four distinct types of transistor, yet only two different gate stacks are needed. NFET 750 has a gate stack including successive layers of hafnium oxide 202, tantalum nitride 302, titanium nitride 708 and aluminum 802, whereas the PFET 752, DDC-NFET 754, and DDC-PFET 756 each have the same gate stack, i.e., hafnium oxide 202, titanium nitride 708 and aluminum 802. It will be appreciated that the embodiment of FIG. 8 is illustrative and not meant to specifically limit the invention.

FIG. 10, discussed above in connection with an illustrative process flow, shows the structure of a partially fabricated integrated circuit in which an NFET 750 and a PFET 752, each having a conventional channel foundation, are formed on the same die as a DDC-NFET 754 and a DDC-PFET 756, each having the DDC channel foundation. In this embodiment there are four distinct types of transistor, yet only two different gate stacks are needed. PFET 752 has a gate stack having successive layers of hafnium oxide 202, titanium nitride 902 and aluminum 1002, whereas NFET 750, DDC-NFET 754, and DDC-PFET 756 each have the same gate stack, i.e., successive layers hafnium oxide 202, tantalum nitride 302, titanium nitride 902 and aluminum 1002. It will be appreciated that the embodiment of FIG. 10 is illustrative and not meant to specifically limit the invention.

FIG. 15, discussed above in connection with an illustrative process flow, shows the structure of a partially fabricated integrated circuit in which an NFET 750 and a PFET 752, each having a conventional channel foundation, are formed on the same die as a DDC-NFET 754 and a DDC-PFET 756, each having the DDC channel foundation. In this embodiment there are four distinct types of transistor, yet only three different gate stacks are used. NFET 750 has a gate stack having successive layers of hafnium oxide 202, tantalum nitride 1202, titanium nitride 1402 and aluminum 1502; PFET 752 has a gate stack having successive layers of hafnium oxide 202, titanium nitride 1402 and aluminum 1502, and DDC-NFET 754 and DDC-PFET 756 each have the same gate stack, i.e., hafnium oxide 202, TiN, layer 1102, titanium nitride 1402 and aluminum 1502. It will be appreciated that alternative gate stacks having different materials may also provide the desired electrical characteristics.

In typical embodiments, the gate stack of at least one NFET is electrically connected to the gate stack of at least one PFET; and the gate stack of at least one DDC-NFET is electrically connected to the gate stack of at least one DDC-PFET. In this way, CMOS circuits are formed of DDC-FETs and other circuits are formed of non-DDC-FETs.

In one illustrative embodiment, a method includes, forming, in a substrate, an NFET channel foundation, a PFET channel foundation, a DDC-NFET channel foundation, and a DDC-PFET channel foundation; and disposing an NFET gate stack over the NFET channel foundation, disposing a PFET gate stack over the PFET channel foundation, disposing a DDC-NFET gate stack over the DDC-NFET channel foundation, and disposing a DDC-PFET gate stack over the DDC-PFET channel foundation; wherein the DDC-NFET gate stack and the DDC-PFET gate stack are the same, or use similar materials; and wherein the NFET gate stack and the PFET gate stack structures, or materials, are different from each other.

In another illustrative embodiment, a method of manufacturing integrated circuits, includes forming a first type of NFET channel region in a substrate; forming a first type of PFET channel region in the substrate; forming a second type of NFET channel region in the substrate; forming a second type of PFET channel region in the substrate; forming a first type of NFET gate stack over at least a portion of the channel region of the first NFET type; forming a first type of PFET gate stack over at least a portion of the channel region of the first PFET type; forming a second type of NFET gate stack over at least a portion of the channel region of the second NFET type; forming a second type of PFET gate stack over at least a portion of the channel region of the second PFET type; wherein each gate stack is spaced apart from the corresponding underlying channel region by a gate dielectric layer. In some embodiments, the first type of NFET gate stack and the first type of PFET gate stack are different from each other, and the second type of NFET gate stack and the second type of PFET gate stack are the same as each other. These gate stacks may be fabricated concurrently to make them the same. It will be appreciated that any manufacturing process has variations or non-uniformities. Thus references to a material or a structure being the same, means that the nominal value, or manufacturing targets, are the same. Alternatively, the NFET gate stack and the second type of PFET gate stack are fabricated with similar materials.

In one embodiment, the second NFET gate stack and the second PFET gate stack are each the same as the first PFET gate stack. In a further embodiment, the second NFET gate stack and the second PFET gate stack are each the same as the first NFET gate stack. In a still further embodiment, the second NFET gate stack is different from both the first NFET gate stack and the first PFET gate stack; and the second PFET gate stack is different from both the first NFET gate stack and the first PFET gate stack.

Various embodiments advantageously provide methods of modifying an existing chip design to replace a portion of the transistors in the existing chip design with DDC transistors.

Various embodiments advantageously provide methods of adding one or more transistor types to an existing chip design without modifying the dimensions, physical construction, or electrical characteristics of the other transistors.

Various embodiments advantageously provide methods of incorporating a plurality FET types in an integrated circuit where FET type is determined by the combination of channel foundation and gate stack, and where at least a portion of the FETs are DDC transistors.

Various embodiments provide NFETs and DDC-NFETs with the same nominal threshold voltage; and PFETs and DDC-PFETs with the same nominal threshold voltage.

CONCLUSION

It is to be appreciated that the Detailed Description section, and not the Abstract of the Disclosure, is intended to be used to interpret the claims. The Abstract of the Disclosure may set forth one or more, but not all, exemplary embodiments, and thus, is not intended to limit the invention and the subjoined Claims in any way.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the subjoined Claims and their equivalents.

What is claimed is:

1. A method of forming an integrated circuit, comprising:
   forming, in a substrate, an NFET channel foundation, a PFET channel foundation, a DDC-NFET channel foundation, and a DDC-PFET channel foundation; and
   disposing an NFET gate stack having a first set of material layers disposed in a first order over the NFET channel foundation, disposing a PFET gate stack having a second set of material layers disposed in a second order over the PFET channel foundation, disposing a DDC-NFET gate stack having a third set of material layers disposed in a third order over the DDC-NFET channel foundation, and disposing a DDC-PFET gate stack having a fourth set of material layers disposed in a fourth order over the DDC-PFET channel foundation;
   wherein the third set of materials layers is the same as the fourth set of material layers, and the third order is the same as the fourth order;
   wherein the first set of material layers, and the second set of material layers are different from each other; and
   wherein each of the DDC-NFET and DDC-PFET channel foundations include at least a screening layer and an undoped epi layer disposed over the screening layer.

2. The method of claim 1, wherein the second set of materials and the second order, the third set of materials and the third order, and the fourth set of materials and the fourth order are the same.

3. The method of claim 1, wherein the first set of materials and the first order, the third set of materials and the third order, and the fourth set of materials and the fourth order are the same.

4. The method of claim 1, wherein the third set of materials and the third order and the fourth set of materials and the fourth order are different from both the first set of mateials and the first order and the second set of materials and the second order.

5. The method of claim 1, wherein
   disposing the NFET gate stack comprises forming a high-k dielectric layer, a tantalum nitride layer disposed over the high-k dielectric layer, a titanium nitride layer disposed over the tantalum nitride layer, and an aluminum layer disposed over the titanium nitride layer.

6. The method of claim 1, wherein forming the NFET channel foundation, the PFET channel foundation, the DDC-NFET channel foundation, and the DDC-PFET channel foundation comprises
   performing well implants for all channel foundations to form NFET and PFET well regions;
   performing a screen implant on the well implants for the DDC-NFET and DDC-PFET foundations to form DDC-NFET and DDC-PFET implanted regions; and
   forming a substrate with substantially undoped blanket epitaxial layer disposed over the NFET and PFET well regions and DDC-NFET and DDC-PFET implanted regions.

7. The method of claim 5, wherein disposing the PFET gate stack comprises disposing a high-k dielectric layer, a titanium nitride layer disposed over the high-k dielectric layer, and an aluminum layer disposed over the titanium nitride layer.

8. The method of claim 5, disposing the DDC NFET gate stack comprises disposing a high-k dielectric layer, a titanium nitride layer disposed over the high-k dielectric layer, and an aluminum layer disposed over the titanium nitride layer.

9. The method of claim 5, disposing the DDC PFET gate stack comprises disposing a high-k dielectric layer, a titanium nitride layer disposed over the high-k dielectric layer, and an aluminum layer disposed over the titanium nitride layer.

* * * * *